US012414455B2

(12) United States Patent
Kim et al.

(10) Patent No.: US 12,414,455 B2
(45) Date of Patent: Sep. 9, 2025

(54) ELECTRONIC DEVICE

(71) Applicant: Samsung Display Co., Ltd., Yongin-si (KR)

(72) Inventors: Taeho Kim, Yongin-si (KR); Hyeoji Kang, Seoul (KR); Ohjeong Kwon, Hwaseong-si (KR); Wooyoung Kim, Yongin-si (KR); Hongyeon Lee, Suwon-si (KR); Seungyeon Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 562 days.

(21) Appl. No.: 17/865,920

(22) Filed: Jul. 15, 2022

(65) Prior Publication Data

US 2023/0096610 A1 Mar. 30, 2023

(30) Foreign Application Priority Data

Aug. 31, 2021 (KR) ........................ 10-2021-0115722

(51) Int. Cl.
*H01L 29/08* (2006.01)
*G06F 3/041* (2006.01)
(Continued)

(52) U.S. Cl.
CPC ......... *H10K 50/865* (2023.02); *G06F 3/0412* (2013.01); *G06F 3/0445* (2019.05);
(Continued)

(58) Field of Classification Search
CPC .... H10K 50/865; H10K 59/40; H10K 50/822; H10K 59/1213; H10K 59/122;
(Continued)

(56) References Cited

U.S. PATENT DOCUMENTS 9,087,998 B2 7/2015 Jang et al.
11,031,572 B2 6/2021 Choi et al.
(Continued)

FOREIGN PATENT DOCUMENTS

KR 10-2019-0141403 12/2019
KR 10-2020-0013819 2/2020
(Continued)

*Primary Examiner* — Elmito Breval
(74) *Attorney, Agent, or Firm* — Womble Bond Dickinson (US) LLP

(57) ABSTRACT

An electronic device includes an electronic module, a display panel including a first display area overlapping the electronic module in a plan view, a second display area not overlapping the same in a plan view and including a light emitting element layer, an inorganic absorption layer, and an encapsulation layer, and a reflection adjusting layer on the display panel and including a dye. The first display area includes an element area including a pixel electrode, a hole transport layer, a light emitting layer, an electron transport layer, and a common electrode, and a transmissive area adjacent to the element area, including the hole transport layer, the electron transport layer, and a pattern layer, and not including the light emitting layer and the common electrode, and the inorganic absorption layer overlaps the element area in a plan view and does not overlap the transmissive area in a plan view.

25 Claims, 15 Drawing Sheets

(51) Int. Cl.
- *G06F 3/044* (2006.01)
- *H10K 50/86* (2023.01)
- *H10K 59/40* (2023.01)
- H10D 86/40 (2025.01)
- H10D 86/60 (2025.01)
- H10K 50/822 (2023.01)
- H10K 59/121 (2023.01)
- H10K 59/122 (2023.01)
- H10K 85/30 (2023.01)

(52) U.S. Cl.
CPC ........... *H10K 59/40* (2023.02); *H10D 86/441* (2025.01); *H10D 86/60* (2025.01); *H10K 50/822* (2023.02); *H10K 59/1213* (2023.02); *H10K 59/122* (2023.02); *H10K 85/30* (2023.02)

(58) Field of Classification Search
CPC .. H10K 85/30; H10K 59/126; H10K 59/8792; G06F 3/0412; G06F 3/0445; H10D 86/441; H10D 86/60
See application file for complete search history.

(56) References Cited

U.S. PATENT DOCUMENTS

| | | |
|---|---|---|
| 11,515,505 B2 | 11/2022 | Chung et al. |
| 2020/0357871 A1 | 11/2020 | Chung et al. |
| 2020/0394964 A1* | 12/2020 | Hyun .................. G09G 3/3208 |

FOREIGN PATENT DOCUMENTS

| | | |
|---|---|---|
| KR | 10-2020-0039866 | 4/2020 |
| KR | 10-2021-0028296 | 3/2021 |

* cited by examiner

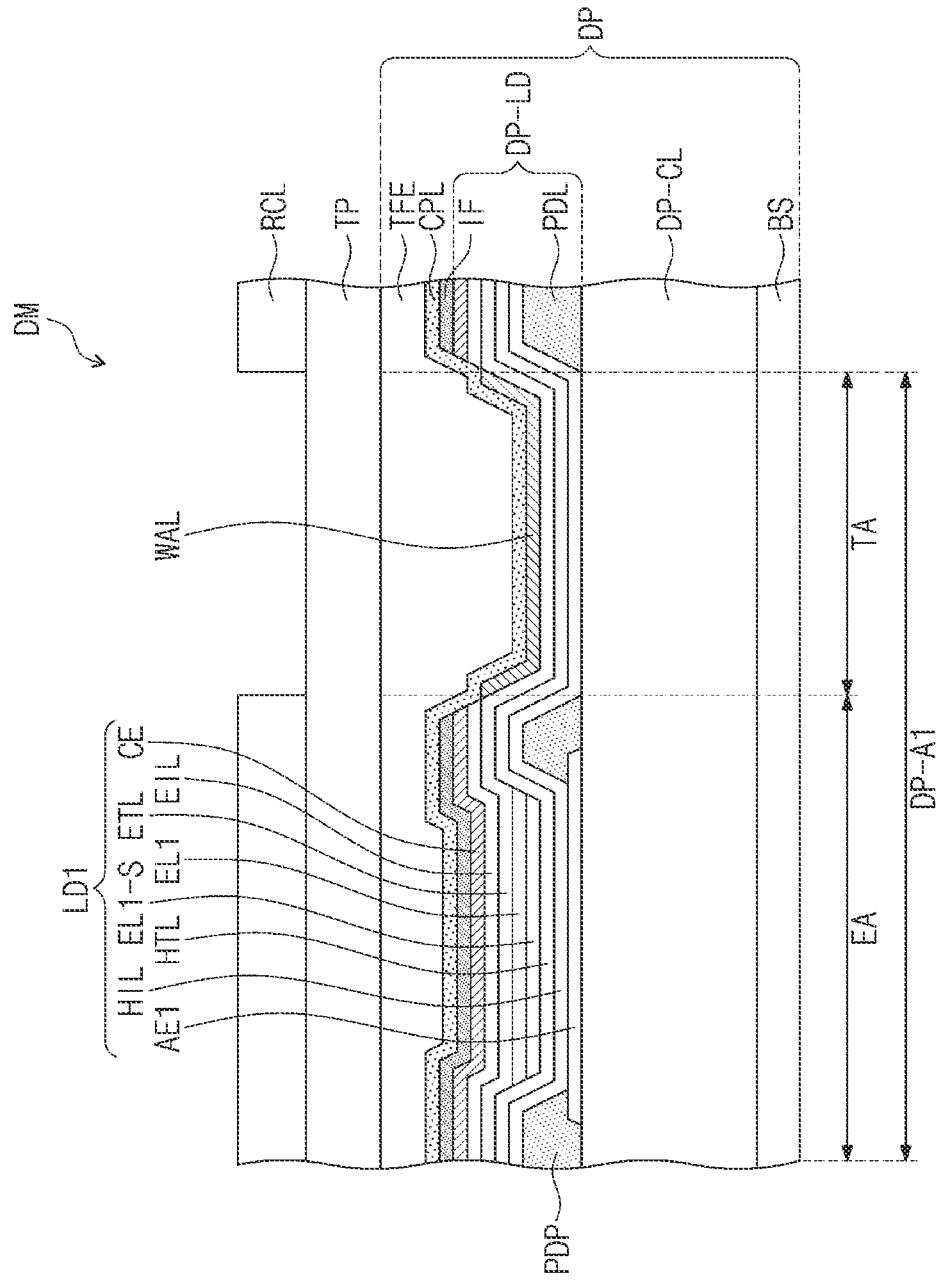

ELECTRONIC DEVICE

CROSS-REFERENCE TO RELATED APPLICATION(S)

This application claims priority to and benefits of Korean Patent Application No. 10-2021-0115722 under 35 U.S.C. § 119, filed on Aug. 31, 2021 in the Korean Intellectual Property Office, the entire contents of which are incorporated herein by reference.

BACKGROUND

1. Technical Field

The disclosure herein relates to an electronic device, and by way of example, to an electronic device having improved transmittance in a portion of a display area.

2. Description of the Related Art

Various types of display devices are used to provide image information, and each of the display devices may include an electronic module that receives an external signal or provides an output signal to the outside. For example, the electronic module may include a camera module, a sensor, a sound module, and the like, and to increase the area, of the display device, in which an image is displayed, consideration is given to disposing the electronic module and the like in the area in which the image is displayed.

Accordingly, it is necessary to improve the sensitivity of the electronic module while maintaining the display quality in the area where the electronic module is disposed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides an electronic device having improved transmittance in a portion of a display area even in case that an anti-reflection member is introduced.

The disclosure provides an electronic device having improved transmittance in a portion of a display area overlapping an electronic module in a plan view.

An embodiment provides an electronic device that may include an electronic module; a display panel including a first display area overlapping the electronic module in a plan view; a second display area not overlapping the electronic module in a plan view; a light emitting element layer; an inorganic absorption layer disposed on the light emitting element layer; and an encapsulation layer disposed on the inorganic absorption layer; and a reflection adjusting layer disposed on the display panel, the reflection adjusting layer may include a dye, wherein the first display area may include an element area including a pixel electrode; a hole transport layer disposed on the pixel electrode; a light emitting layer disposed on the hole transport layer; an electron transport layer disposed on the light emitting layer; and a common electrode disposed on the electron transport layer; and a transmissive area adjacent to the element area, the transmissive area may include the hole transport layer, the electron transport layer, and a pattern layer disposed on the electron transport layer; the transmissive area may not include the light emitting layer and the common electrode, and the inorganic absorption layer overlaps the element area in a plan view and does not overlap the transmissive area in a plan view.

In an embodiment, the pattern layer may include a fluorine-based compound.

In an embodiment, the pattern layer may not overlap the common electrode and the inorganic absorption layer in a plan view.

In an embodiment, the display panel may include a capping layer disposed on an upper or lower portion of the inorganic absorption layer.

In an embodiment, the inorganic absorption layer may be disposed between the common electrode and the capping layer, and the capping layer may overlap the element area and the transmissive area in a plan view.

In an embodiment, the capping layer may be disposed between the common electrode and the inorganic absorption layer, and the capping layer may overlap the element area and the transmissive area in a plan view.

In an embodiment, the transmissive area may include an upper pattern layer disposed on the capping layer, the upper pattern layer may include a fluorine-based compound, and the inorganic absorption layer does not overlap the upper pattern layer in a plan view.

In an embodiment, the inorganic absorption layer may include a single metal or an alloy having a refractive index of about 1 or higher and an extinction coefficient of about 5 or lower.

In an embodiment, the inorganic absorption layer may include at least one of a transition metal, a post-transition metal, a lanthanide metal, and an alloy of two or more metals selected from the transition metal, the post-transition metal, and the lanthanide metal.

In an embodiment, the reflection adjusting layer may overlap the element area in a plan view and may not overlap the transmissive area in a plan view.

In an embodiment, the reflection adjusting layer may include a first dye having a maximum absorption wavelength in a range of about 420 nm to about 510 nm and a second dye having a maximum absorption wavelength in a range of about 550 nm to about 600 nm.

In an embodiment, the reflection adjusting layer may include a porphyrin-based dye or a tetraazaporphyrin-based dye.

In an embodiment, the electronic device may further include a sensor layer disposed between the display panel and the reflection adjusting layer, wherein the sensor layer may include a sensing base layer; a first conductive layer disposed on the sensing base layer; a second conductive layer disposed on the first conductive layer; and a sensing insulating layer disposed between the first conductive layer and the second conductive layer.

In an embodiment, the reflection adjusting layer may include a division layer that overlaps the second conductive layer in a plan view, and the division layer does not overlap the first display area in a plan view.

In an embodiment, the sensor layer may be disposed directly on the encapsulation layer.

In an embodiment, an electronic device may include a display panel including an auxiliary display area including an element area and a transmissive area and a main display area adjacent to the auxiliary display area; and a reflection adjusting layer disposed on the display panel, wherein the display panel may include a base layer; a circuit layer disposed on the base layer; a light emitting element layer disposed on the circuit layer; an encapsulation layer disposed on the light emitting element layer; a pattern layer disposed between the circuit layer and the encapsulation layer in the transmissive area; and an inorganic absorption layer that does not overlap the pattern layer in a plan view and is disposed between the light emitting element layer and the encapsulation layer.

In an embodiment, in the auxiliary display area, the light emitting element layer may include a pixel electrode disposed on the circuit layer and not overlapping the transmissive area in a plan view; a pixel defining pattern including an opening exposing a top surface of the pixel electrode; a hole transport layer disposed on the pixel electrode and provided as a common layer in the element area and the transmissive area; a light emitting layer disposed on the hole transport layer in the opening of the pixel defining pattern; an electron transport layer disposed on the light emitting layer and provided as a common layer in the element area and the transmissive area; and a common electrode disposed on the electron transport layer, and the common electrode does not overlap the pattern layer in a plan view.

In an embodiment, the display panel may include a capping layer disposed between the light emitting element layer and the encapsulation layer.

In an embodiment, the capping layer may be disposed on a top surface of the inorganic absorption layer and may be provided as a common layer in the element area and the transmissive area.

In an embodiment, the capping layer may be disposed on a bottom surface of the inorganic absorption layer and may be provided as a common layer in the element area and the transmissive area, the display panel may include an upper pattern layer disposed on the capping layer in the transmissive area, and the inorganic absorption layer may not overlap the upper pattern layer in a plan view.

In an embodiment, the capping layer may be disposed on a top surface or a bottom surface of the inorganic absorption layer and may not overlap the pattern layer in a plan view.

In an embodiment, the display panel may include an auxiliary pattern layer extending from the pattern layer and disposed on the pixel defining pattern, and the inorganic absorption layer and the common electrode do not overlap the auxiliary pattern layer in a plan view.

In an embodiment, the light emitting element layer may include an electron injection layer disposed between the electron transport layer and the common electrode, and the electron injection layer does not overlap the pattern layer in a plan view.

In an embodiment, the reflection adjusting layer may include a first dye having a maximum absorption wavelength in a range of about 420 nm to about 510 nm and a second dye having a maximum absorption wavelength in a range of about 550 nm to about 600 nm, and the reflection adjusting layer may not overlap the transmissive area in a plan view.

In an embodiment, the inorganic absorption layer may include at least one of a transition metal, a post-transition metal, a lanthanide metal, and an alloy of two or more metals selected from the transition metal, the post-transition metal, and the lanthanide metal.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to describe principles of the disclosure. In the drawings:

FIG. 8 is a schematic cross-sectional view of a display module according to an embodiment;

DETAILED DESCRIPTION OF THE EMBODIMENTS

Figure 1:
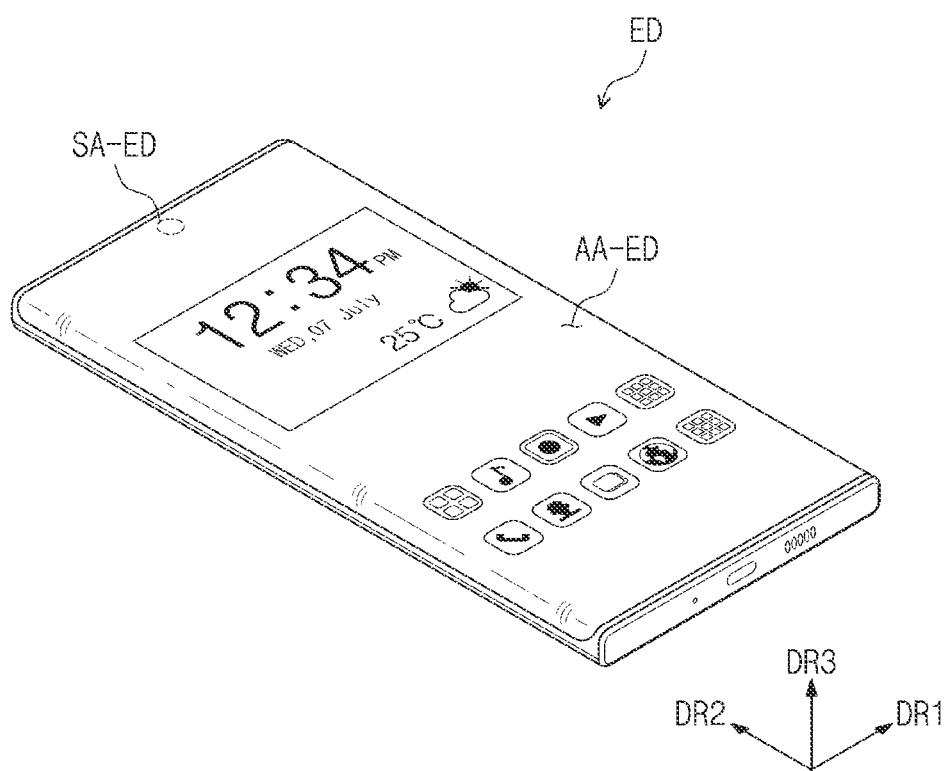
FIG. 1 is a schematic perspective view of an electronic device according to an embodiment.

As the disclosure can have various changes and modifications made thereto and take many forms, example embodiments are illustrated in the accompanying drawings and are hereinafter described in detail. However, it should be understood that this is not intended to limit the disclosure but is intended to include all changes and modifications, equivalents, and substitutes within the spirit and scope of the disclosure.

It will be understood that when an element or layer (or region, portion, and the like) is referred to as being "on", "connected to", or "coupled to" another element or layer, it can be directly on, connected to, or coupled to the other element or layer, or intervening elements or layers may be present.

It will be understood that the terms "connected to" or "coupled to" may include a physical or electrical connection or coupling.

The expression "directly disposed" may refer to a case that there is no layer, film, region, or plate added between a component such as a layer, a film, a region, and a plate and another component. For example, "directly disposed on" may mean disposing a layer or a member or element on another layer or another member or element without using an additional member or elements such as, for example, an adhesive member between the two layers or the two members or elements.

Like reference numerals refer to like elements throughout this specification. In the drawings, the thicknesses, ratios, and dimensions of elements may be exaggerated for effective description of the technical contents.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the disclosure.

As used herein, the singular forms, "a", "an", and "the" are intended to include the plural forms as well, unless the context clearly indicates otherwise.

Spatially relative terms, such as "beneath", "below", "lower", "above", and "upper" may be used herein for ease of description to describe one element or feature's relationship to another element(s) or feature(s) as illustrated in the figures but is not limited thereto. It will be understood that the spatially relative terms are intended to encompass different orientations of the device in use or operation in addition to the orientation depicted in the figures. In this specification, the expression "disposed on" may refer to not only a case that a member is disposed on an upper portion of another member but also a case that the member is disposed on a lower portion of the other member.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be further understood that the terms "comprises," "comprising," "includes," and/or "including,", "has," "have," and/or "having," and variations thereof, when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning or meanings consistent with their meaning or meanings in the context of the relevant art and should not be interpreted in an overly idealized or overly formal sense unless expressly so defined herein.

Hereinafter, an electronic device according to an embodiment will be described with reference to the accompanying drawings.

FIG. 1 is a schematic perspective view of an electronic device according to an embodiment. Referring to FIG. 1, an electronic device ED may be a device that is activated according to an electrical signal. For example, the electronic device ED may be a mobile phone, a tablet, a monitor, a television, a car navigation device, a game machine, or a wearable device, but is not limited thereto. FIG. 1 illustrates the electronic device ED as a mobile phone.

The electronic device ED may display an image through a display area AA-ED. The display area AA-ED may include a plane defined by a first direction axis DR1 and a second direction axis DR2. The display area AA-ED may further include curved surfaces respectively bent from at least two sides of the plane. However, the shape of the display area AA-ED is not limited thereto. For example, the display area AA-ED may include only the plane or may further include four curved surfaces respectively bent from at least two sides, for example, four sides of the plane.

A sensing area SA-ED may be defined in the display area AA-ED of the electronic device ED. FIG. 1 illustrates one sensing area SA-ED, but the number of sensing areas SA-ED is not limited thereto. The sensing area SA-ED may be a portion of the display area AA-ED. Accordingly, the electronic device ED may display an image through the sensing area SA-ED.

An electronic module may be disposed in an area overlapping the sensing area SA-ED. The electronic module may receive an external input transmitted through the sensing area SA-ED or may provide an output through the sensing area SA-ED. For example, the electronic module may be a camera module, a sensor measuring distance, such as a proximity sensor, a sensor that senses a part of a user's body (for example, a fingerprint, an iris, or a face), or a small lamp outputting light, but the electronic module is not particularly limited thereto.

A thickness direction of the electronic device ED may be parallel to a third direction axis DR3 crossing or intersecting the first direction axis DR1 and the second direction axis DR2. Accordingly, a front surface (or a top surface) and a rear surface (or a bottom surface) of each of members constituting the electronic device ED may be defined based on the third direction axis DR3.

Figure 2:
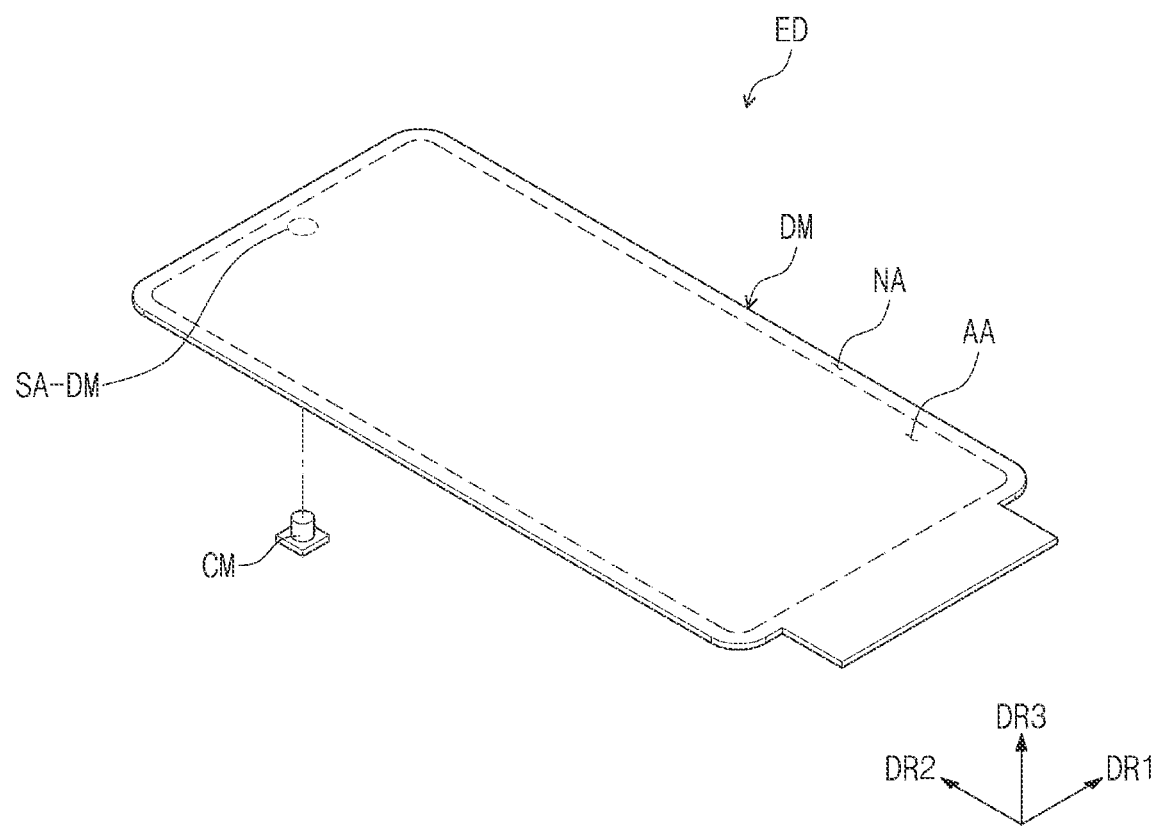
FIG. 2 is an exploded perspective view illustrating components of an electronic device according to an embodiment.

FIG. 2 is an exploded perspective view illustrating components of an electronic device according to an embodiment. Referring to FIG. 2, the electronic device ED may include a display module DM and an electronic module CM. The display module DM may be a component that generates an image and senses an externally applied input. The electronic module CM may be disposed below the display module DM and may be, for example, a camera module. The display module DM may be referred to as a first electronic module, and the electronic module CM as a second electronic module.

A display area AA and a peripheral area NA may be defined in the display module DM. The display area AA may correspond to the display area AA-ED illustrated in FIG. 1. A partial area of the display module DM may have a higher transmittance than another partial area and may be defined as a sensing area SA-DM. The sensing area SA-DM may be a portion of the display area AA. For example, the sensing area SA-DM may display an image and may transmit an external input provided to the electronic module CM and/or an output from the electronic module CM.

Figure 3:
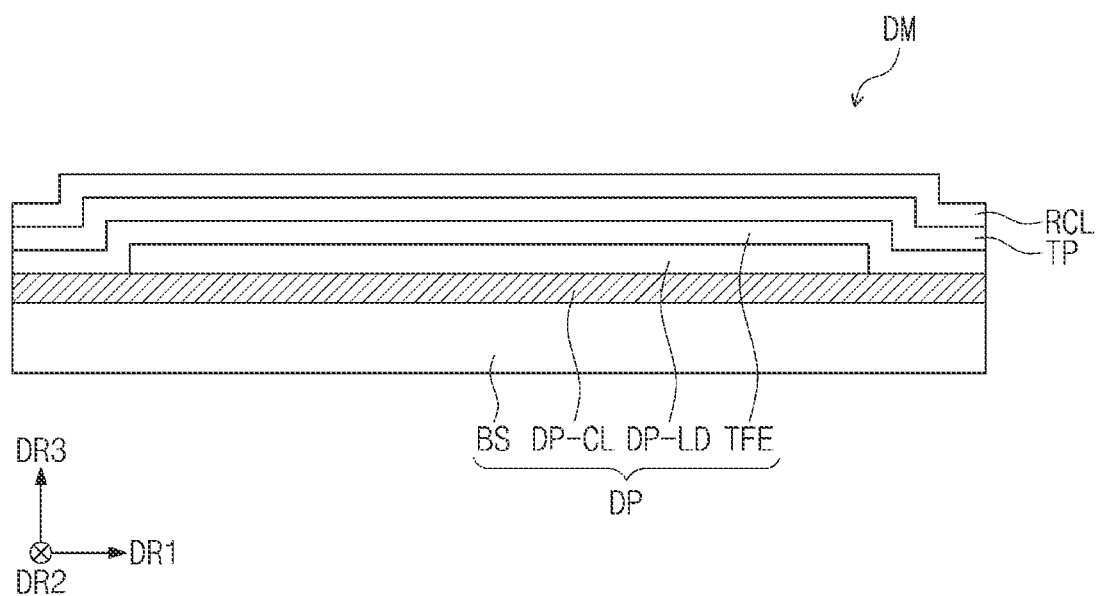
FIG. 3 is a schematic cross-sectional view of a display module according to an embodiment.

FIG. 3 is a schematic cross-sectional view of a display module according to an embodiment. Referring to FIG. 3, the display module DM may include a display panel DP, a sensor layer TP, and a reflection adjusting layer RCL.

The display panel DP may be a component that substantially generates an image. The display panel DP may be a light emitting display panel and may be, for example, an organic light emitting display panel, an inorganic light emitting display panel, a quantum dot display panel, a micro-LED display panel, or a nano-LED display panel. The display panel DP may be referred to as a display layer.

The display panel DP may include a base layer BS, a circuit layer DP-CL, a light emitting element layer DP-LD, and an encapsulation layer TFE.

The base layer BS may be a member providing a base surface on which the circuit layer DP-CL is disposed. The base layer BS may be a rigid substrate or a flexible substrate capable of bending, folding, or rolling. The base layer BS may be a glass substrate, a metal substrate, a polymer substrate, or the like within the spirit and the scope of the disclosure. However, an embodiment is not limited thereto, and the base layer BS may be an inorganic layer, an organic layer, or a composite material layer. For example, in an embodiment, the base layer BS may include an organic layer formed of transparent polyimide.

The base layer BS may have a multilayer structure. For example, the base layer BS may include a first synthetic resin layer, an intermediate layer having a multilayer or single-layer structure, and a second synthetic resin layer disposed on the intermediate layer. The intermediate layer may be referred to as a base barrier layer. The intermediate layer may include a silicon oxide ($SiO_x$) layer and an amorphous silicon (a-Si) layer disposed on the silicon oxide layer, but an embodiment is not limited thereto. For example, the intermediate layer may include at least one of a silicon oxide layer, a silicon nitride layer, a silicon oxynitride layer, or an amorphous silicon layer.

Each of the first and second synthetic resin layers may include polyimide-based resin. Each of the first and second synthetic resin layers may include at least one of acrylate-based resin, methacrylate-based resin, polyisoprene-based resin, vinyl-based resin, epoxy-based resin, urethane-based resin, cellulose-based resin, siloxane-based resin, polyamide-based resin, or perylene-based resin. In this specification, " . . . "-based resin means that the " . . . "-based resin includes a functional group of " . . . ". The polyimide-based resin may be transparent polyimide-based resin.

The circuit layer DP-CL may be disposed on the base layer BS. The circuit layer DP-CL may include an insulating layer, a semiconductor pattern, a conductive pattern, a signal line, and the like within the spirit and the scope of the disclosure. The insulating layer, a semiconductor layer, and a conductive layer may be formed on the base layer BS in a method such as coating and deposition, and thereafter, the insulating layer, the semiconductor layer, and the conductive layer may be selectively patterned through a number of times of a photolithography process. Thereafter, the semiconductor pattern, the conductive pattern, and the signal line included in the circuit layer DP-CL may be formed.

The light emitting element layer DP-LD may be disposed on the circuit layer DP-CL. The light emitting element layer DP-LD may include a light emitting element. For example, the light emitting element layer DP-LD may include an organic light emitting material, an inorganic light emitting material, an organic-inorganic light emitting material, a quantum dot, a quantum rod, a micro-LED, or a nano-LED.

The encapsulation layer TFE may be disposed on the light emitting element layer DP-LD. The encapsulation layer TFE may protect the light emitting element layer DP-LD from foreign matter such as moisture, oxygen, and dust particles.

The sensor layer TP may be disposed on the display panel DP. The sensor layer TP may sense an external input applied from the outside. The external input may be a user's input. The user's input may include various types of external inputs such as a part of a user's body, light, heat, a pen, and pressure.

In the display module DM according to an embodiment, the sensor layer TP may be formed on the display panel DP through a continuous process. The sensor layer TP may be said to be disposed on or directly disposed on the display panel DP. The expression "directly disposed" may mean that a third component is not disposed between the sensor layer TP and the display panel DP. For example, a separate adhesive member may not be disposed between the sensor layer TP and the display panel DP. For example, in an embodiment, the sensor layer TP may be bonded to display panel DP by an adhesive member. The adhesive member may include an adhesive or a detachable adhesive.

The reflection adjusting layer RCL may be disposed on the sensor layer TP. The reflection adjusting layer RCL may reduce the degree of reflection due to external light incident from the outside of the display module DM. The reflection adjusting layer RCL may be used together with an inorganic absorption layer IF (see FIG. 7A) to be described later to serve as an anti-reflection member. For example, the reflection adjusting layer RCL may be used together with the inorganic absorption layer IF (see FIG. 7A) to be described later to reduce reflected light that is reflected from metal layers included in the display panel DP. For example, the reflection adjusting layer RCL may be used together with the inorganic absorption layer IF (see FIG. 7A) to be described later to reduce reflected light that is reflected from a common electrode of the light emitting element, or the like within the spirit and the scope of the disclosure.

The reflection adjusting layer RCL may be formed on the sensor layer TP through a continuous process. For example, the reflection adjusting layer RCL may be provided on the sensor layer TP by using an inkjet printing method.

The reflection adjusting layer RCL may include a dye. The reflection adjusting layer RCL may include both a first dye having a maximum absorption wavelength $\lambda_{max}$ ranging from about 420 nm to about 510 nm and a second dye having a maximum absorption wavelength $\lambda_{max}$ ranging from about 550 nm to about 600 nm. In an embodiment, the reflection adjusting layer RCL may include a porphyrin-based dye, a tetraazaporphyrin-based dye, or the like within the spirit and the scope of the disclosure.

In an embodiment, the reflection adjusting layer RCL may further include a pigment in addition to the dye. The reflection adjusting layer RCL may further include an organic pigment, an inorganic pigment, or the like within the spirit and the scope of the disclosure. The reflection adjusting layer RCL may further include a black matrix. For example, the reflection adjusting layer RCL may further include a black matrix disposed to correspond to an area that divides pixels in consideration of the arrangement of the pixels included in the display panel DP. In an embodiment, the black matrix included in the reflection adjusting layer RCL may correspond to a division layer BM (see FIG. 7A) to be described later. The reflection adjusting layer RCL may further include an additional black matrix component in addition to the division layer BM (see FIG. 7A).

Figure 4:
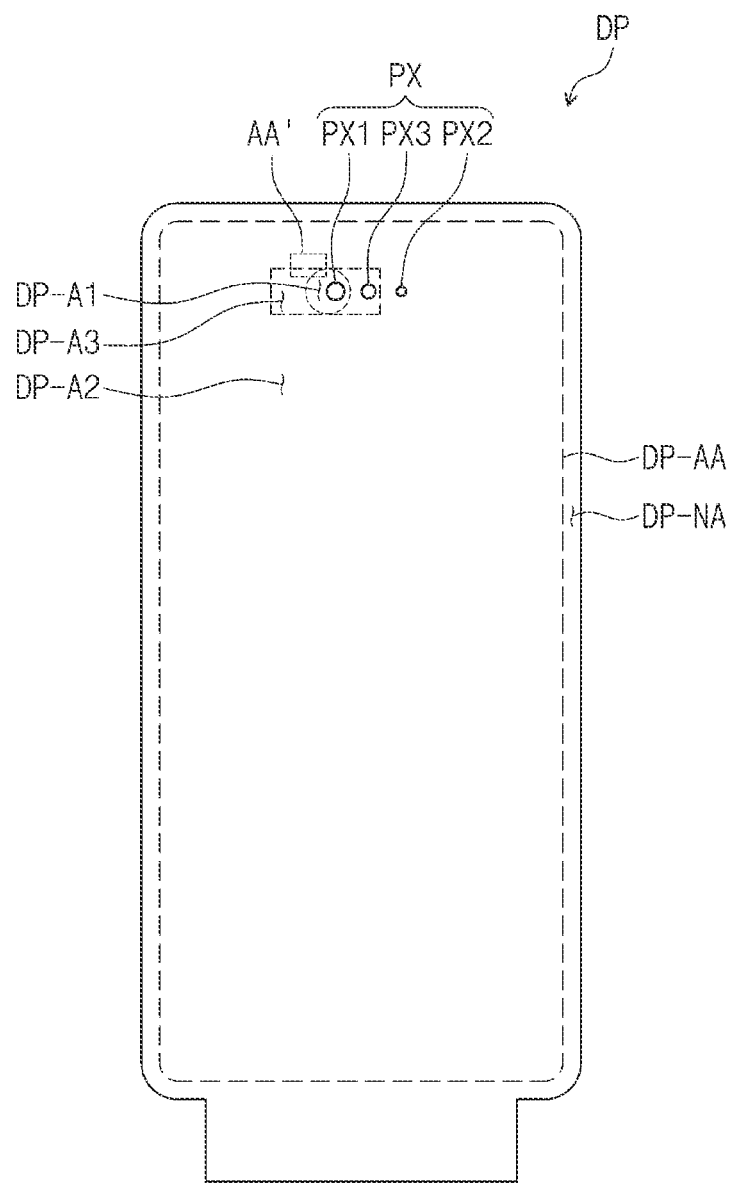
FIG. 4 is a schematic plan view of a display panel according to an embodiment.
Figure 5:
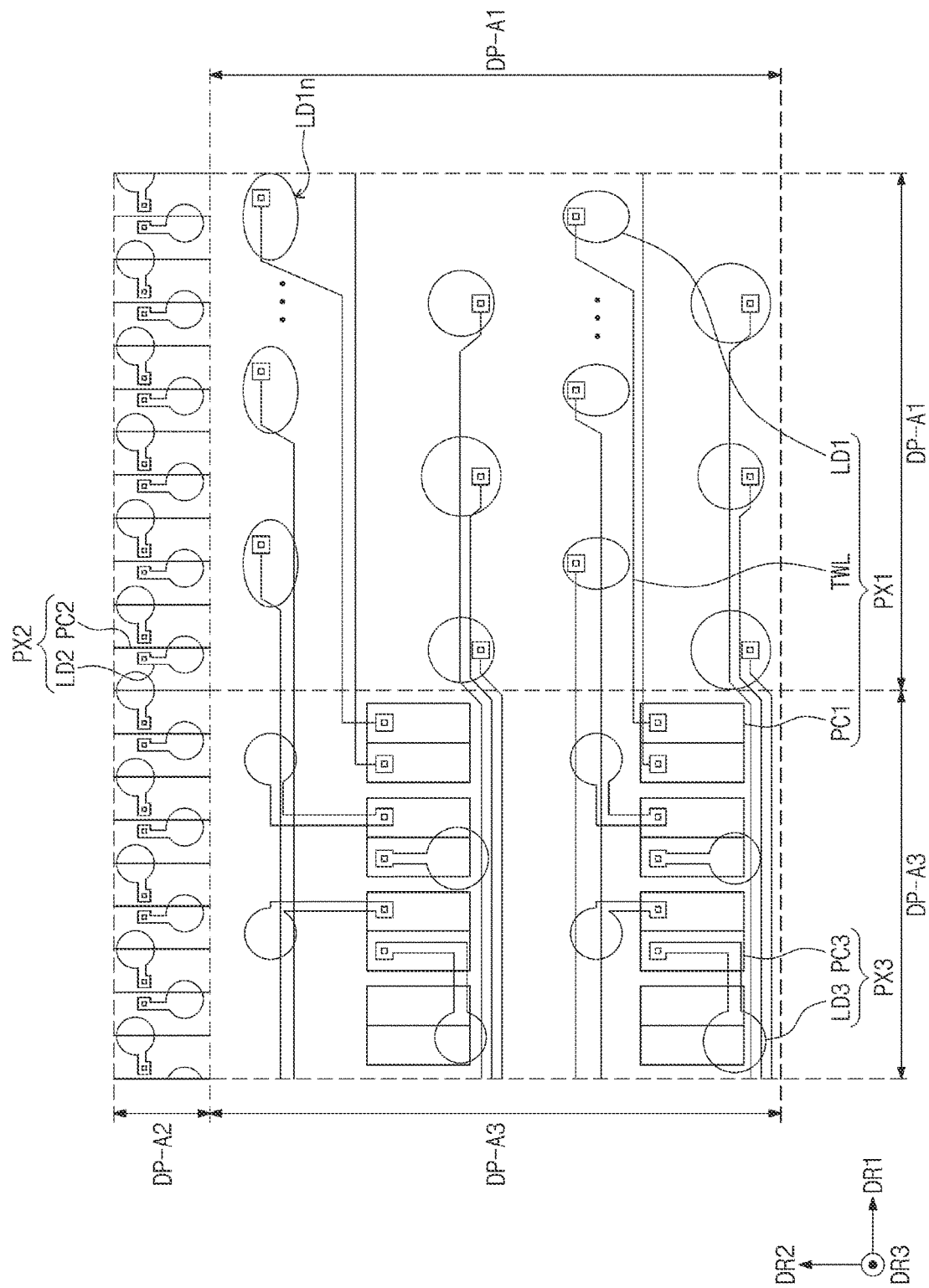
FIG. 5 is an enlarged schematic plan view illustrating the area AA' of FIG. 4.

FIG. 4 is a schematic plan view of a display panel according to an embodiment. FIG. 5 is an enlarged schematic plan view illustrating the area AA' of FIG. 4.

Referring to FIG. 4 and FIG. 5, the display panel DP may include a display area DP-AA and a peripheral area DP-NA. The peripheral area DP-NA may be adjacent to the display area DP-AA and may surround at least a portion of the display area DP-AA.

The display area DP-AA may include a first display area DP-A1, a second display area DP-A2, and a third display area DP-A3. The first display area DP-A1 may be referred to as a component area, the second display area DP-A2 may be referred to as a main display area or a general display area, and the third display area DP-A3 may be referred to as an intermediate area or a transition area. The first display area DP-A1 and the third display area DP-A3 may be referred to as an auxiliary display area. In the auxiliary display area, an element area EA (see FIG. 7B) and a transmissive area TA (see FIG. 7B) may be defined. The element area EA (see FIG. 7B) and the transmissive area TA (see FIG. 7B) may be defined in the first display area DP-A1.

The display panel DP may include pixels PX. The pixels PX may include a first pixel PX1 emitting light in the first display area DP-A1, a second pixel PX2 emitting light in the second display area DP-A2, and a third pixel PX3 emitting light in the third display area DP-A3.

Each of the first pixel PX1, the second pixel PX2, and the third pixel PX3 may be provided in plurality. Each of the first to third pixels PX1, PX2, and PX3 may include a red pixel, a green pixel, and a blue pixel, and may further include a white pixel according to an embodiment.

The first pixel PX1 may include a first light emitting element LD1 and a first pixel circuit PC1 for driving the first light emitting element LD1, the second pixel PX2 may include a second light emitting element LD2 and a second pixel circuit PC2 for driving the second light emitting element LD2, and the third pixel PX3 may include a third light emitting element LD3 and a third pixel circuit PC3 for driving the third light emitting element LD3. The positions of the first pixel PX1, the second pixel PX2, and the third pixel PX3 illustrated in FIG. 4 are illustrated to respectively correspond to the positions of the first, second, and third light emitting elements LD1, LD2, and LD3.

The first display area DP-A1 may overlap or correspond to the sensing area SA-ED illustrated in FIG. 1. For example, the first display area DP-A1 may be provided in an area overlapping the electronic module CM (see FIG. 2) when viewed in a plan view. For example, an external input (for example, light) may be provided to the electronic module CM through the first display area DP-A1, and an output from the electronic module CM may be outputted to the outside through the first display area DP-A1. Although illustrated as a circular shape in this embodiment, the first display area DP-A1 may have various shapes such as a polygon, an ellipse, a figure having at least one curved side or a curved side, and an atypical shape, and is not limited to any one embodiment. It is to be understood that the shapes disclosed herein may include shapes substantially identical or similar to the shapes.

The first display area DP-A1 may have a higher transmittance than the second display area DP-A2. To sufficiently secure the surface area of the transmissive area, a smaller number of pixels may be provided in the first display area DP-A1 than in the second display area DP-A2. An area of the first display area DP-A1 in which the first light emitting element LD1 is not disposed may be defined as the transmissive area. For example, in the first display area DP-A1, an area in which a first pixel electrode of the first light emitting element LD1 and a pixel defining pattern surrounding the first pixel electrode are not disposed may be defined as the transmissive area.

Within a unit surface area or the same surface area, the number of the first pixels PX1 disposed in the first display area DP-A1 may be less than the number of the second pixels PX2 disposed in the second display area DP-A2. For example, the resolution of the first display area DP-A1 may be about ½, about ⅜, about ⅓, about ¼, about ⅖, about ⅛, about ⅑, about ¹⁄₁₆, and the like of the resolution of the second display area DP-A2.

The first pixel circuit PC1 of the first pixel PX1 may not be disposed in the first display area DP-A1. For example, the first pixel circuit PC1 may be disposed in the third display area DP-A3 or the peripheral area DP-NA. The light transmittance of the first display area DP-A1 in this example may be higher than in the example in which the first pixel circuit PC1 is disposed in the first display area DP-A1.

The first light emitting element LD1 and the first pixel circuit PC1 may be electrically connected to each other through a connection line TWL. The connection line TWL may overlap the transmissive area of the first display area DP-A1. The connection line TWL may include a transparent conductive line. The transparent conductive line may include a transparent conductive material or a light-transmissive material. For example, the connection line TWL may be formed of a film of transparent conductive oxide (TCO) such as indium tin oxide (ITO), indium zinc oxide (IZO), indium gallium zinc oxide (IGZO), zinc oxide (ZnO), zinc peroxide (ZnO2), and indium oxide (In2O3).

The third display area DP-A3 may be adjacent to the first display area DP-A1. The third display area DP-A3 may surround at least a portion of the first display area DP-A1. The third display area DP-A3 may have a lower transmittance than the first display area DP-A1. In this embodiment, the third display area DP-A3 may be spaced apart from the peripheral area DP-NA. However, an embodiment is not limited thereto, and the third display area DP-A3 may be in contact with the peripheral area DP-NA.

The first pixel circuit PC1 of the first pixel PX1, the third light emitting element LD3, and the third pixel circuit PC3 may be disposed in the third display area DP-A3. Accordingly, the light transmittance of the third display area DP-A3 may be lower than the light transmittance of the first display area DP-A1. As the first pixel circuit PC1 of the first pixel PX1 is disposed in the third display area DP-A3, the number of the third pixels PX3 disposed in the third display area DP-A3 may be, within a unit surface area or the same surface area, less than the number of the second pixels PX2 disposed in the second display area DP-A2. The resolution of an image displayed in the third display area DP-A3 may be lower than the resolution of an image displayed in the second display area DP-A2.

The second display area DP-A2 may be adjacent to the third display area DP-A3. The second display area DP-A2 may be defined as an area having transmittance lower than that of the first display area DP-A1. The second light emitting element LD2 and the second pixel circuit PC2 may be disposed in the second display area DP-A2.

To secure a space from the second light emitting element LD2 disposed in the second display area DP-A2, a first light emitting element LD1n disposed in a portion of the first display area DP-A1 disposed closest to the second display area DP-A2 may have a circular shape having a larger width in a specific or given direction. For example, in case that the first display area DP-A1 may be adjacent to the second display area DP-A2 in a direction of the second direction axis DR2, a width of the first light emitting element LD1n in a direction of the first direction axis DR1 may be larger than a width thereof in the direction of the second direction axis DR2.

Each of the first light emitting element LD1, the second light emitting element LD2, and the third light emitting element LD3 may be provided in plurality. A distance between two first light emitting elements closest to each other among the first light emitting elements LD1 may be greater than a distance between two second light emitting elements closest to each other among the second light emitting elements LD2. A distance between two third light emitting elements closest to each other among the third light emitting elements LD3 may be greater than a distance between two second light emitting elements closest to each other among the second light emitting elements LD2.

The first, second, and third light emitting elements LD1, LD2, and LD3 illustrated in FIG. 5 may respectively correspond to planar shapes of a first pixel electrode AE1 (see FIG. 7B) of the first light emitting element LD1, a second pixel electrode AE2 (see FIG. 7A) of the second light emitting element LD2, and a third pixel electrode AE3 (see FIG. 7B) of the third light emitting element LD3. A surface area of the first pixel electrode AE1 (see FIG. 7B) may be larger than a surface area of the second pixel electrode AE2 (see FIG. 7A).

Figure 6:
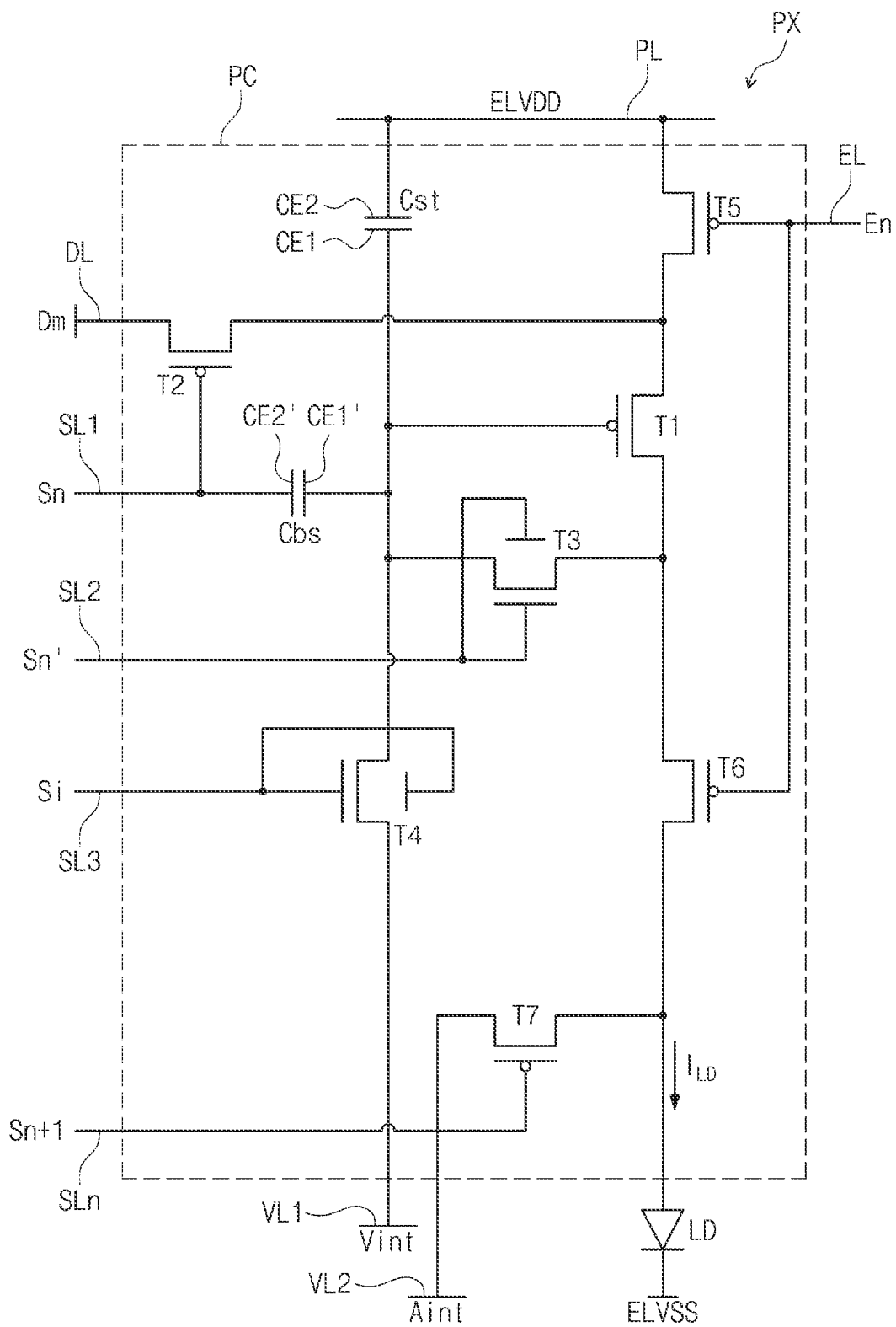
FIG. 6 is a schematic diagram of an equivalent circuit of one of pixels according to an embodiment.

FIG. 6 is a schematic diagram of an equivalent circuit of one of pixels according to an embodiment. Referring to FIG. 6, a schematic diagram of an equivalent circuit of one pixel PX of the pixels PX is illustrated. The pixel PX illustrated in FIG. 6 may be the first pixel PX1 (see FIG. 4), the second pixel PX2 (see FIG. 4), or the third pixel PX3 (see FIG. 4). The pixel PX may include a light emitting element LD and a pixel circuit PC. The light emitting element LD may be a component included in the light emitting element layer DP-LD of FIG. 3, and the pixel circuit PC may be a component included in the circuit layer DP-CL of FIG. 3.

The pixel circuit PC may include thin film transistors T1 to T7 and a storage capacitor Cst. The thin film transistors T1 to T7 and the storage capacitor Cst may be electrically connected to signal lines SL1, SL2, SL3, SLn, EL, and DL, a first initialization voltage line VL1, a second initialization voltage line VL2 (or an anode initialization voltage line), and a driving voltage line PL. In an embodiment, at least one of the above-described lines, for example, the driving voltage line PL may be shared by neighboring pixels PX.

The thin film transistors T1 to T7 may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The light emitting element LD may include a first electrode (for example, an anode electrode or the pixel electrode) and a second electrode (for example, a cathode electrode or a common electrode), and the first electrode of the light emitting element LD may be connected to the driving thin film transistor T1 through the emission control thin film transistor T6 to receive a driving current ILD, and the second electrode of the light emitting element LD may receive a low power supply voltage ELVSS. The light emitting element LD may generate light having luminance corresponding to the driving current ILD.

Some or a number of the thin film transistors T1 to T7 may be provided as n-channel MOSFETs (NMOS), and the others thereof may be provided as p-channel MOSFETs (PMOS). For example, the compensation thin film transistor T3 and the first initialization thin film transistor T4 of the thin film transistors T1 to T7 may be provided as n-channel MOSFETs (NMOS), and the others thereof may be provided as p-channel MOSFETs (PMOS).

In an embodiment, a compensation thin film transistor T3, a first initialization thin film transistor T4, and a second initialization thin film transistor T7 of thin film transistors T1 to T7 may be provided as NMOS, and the others thereof may be provided as PMOS. For example, only one of the thin film transistors T1 to T7 may be provided as NMOS, and the others thereof may be provided as PMOS. For example, all of the thin film transistors T1 to T7 may be provided as NMOS, or all thereof may be provided as PMOS.

The signal lines may include a first scan line SL1 transmitting a first scan signal Sn, a second scan line SL2 transmitting a second scan signal Sn', a third scan line SL3 transmitting a third scan signal Si to the first initialization thin film transistor T4, an emission control line EL transmitting an emission control signal En to the operation control thin film transistor T5 and the emission control thin film transistor T6, a next scan line SLn transmitting a next scan signal Sn+1 to the second initialization thin film transistor T7, and a data line DL that crosses or intersects the first scan line SL1 and transmits a data signal Dm. The first scan signal Sn may be a current scan signal, and the next scan signal Sn+1 may be a scan signal occurring after the first scan signal Sn.

The driving voltage line PL may transmit a driving voltage ELVDD to the driving thin film transistor T1, and the first initialization voltage line VL1 may transmit an initialization voltage Vint for initializing the driving thin film transistor T1 and the pixel electrode.

A driving gate electrode of the driving thin film transistor T1 may be connected to the storage capacitor Cst, and a driving source region of the driving thin film transistor T1 may be connected to the driving voltage line PL via the operation control thin film transistor T5, and a driving drain region of the driving thin film transistor T1 may be electrically connected to the first electrode of the light emitting element LD via the emission control thin film transistor T6. The driving thin film transistor T1 may receive the data signal Dm according to a switching operation of the switching thin film transistor T2 to supply the driving current ILD to the light emitting element LD.

A switching gate electrode of the switching thin film transistor T2 may be connected to the first scan line SL1 transmitting the first scan signal Sn, and a switching source region of the switching thin film transistor T2 may be connected to the data line DL, and a switching drain region of the switching thin film transistor T2 may be connected to the driving source region of the driving thin film transistor T1 and connected to the driving voltage line PL via the operation control thin film transistor T5. The switching thin film transistor T2 may perform the switching operation in which the switching thin film transistor T2 is turned on according to the first scan signal Sn transmitted through the first scan line SL1 and transmits, to the driving source region of the driving thin film transistor T1, the data signal Dm transmitted through the data line DL.

A compensation gate electrode of the compensation thin film transistor T3 is connected to the second scan line SL2. A compensation drain region of the compensation thin film transistor T3 may be connected to the driving drain region of the driving thin film transistor T1 and may be connected to the pixel electrode of the light emitting element LD via the emission control thin film transistor T6. A compensation source region of the compensation thin film transistor T3 may be connected to a first electrode CE1 of the storage capacitor Cst and the driving gate electrode of the driving thin film transistor T1. The compensation source region may be connected to a first initialization drain region of the first initialization thin film transistor T4.

The compensation thin film transistor T3 may be turned on according to the second scan signal Sn' received through the second scan line SL2 and may electrically connect the driving gate electrode and the driving drain region of the driving thin film transistor T1 to allow the driving thin film transistor T1 to be diode-connected.

A first initialization gate electrode of the first initialization thin film transistor T4 may be connected to the third scan line SL3. A first initialization source region of the first initialization thin film transistor T4 may be connected to a second initialization source region of the second initialization thin film transistor T7 and the first initialization voltage line VL1. The first initialization drain region of the first initialization thin film transistor T4 may be connected to the first electrode CE1 of the storage capacitor Cst, the compensation source region of the compensation thin film transistor T3, and the driving gate electrode of the driving thin film transistor T1. The first initialization thin film transistor T4 may be turned on according to the third scan signal Si received through the third scan line SL3 and may perform an initialization operation in which the first initialization thin film transistor T4 transmits the initialization voltage Vint to the driving gate electrode of the driving thin film transistor T1 and initializes the voltage of the driving gate electrode of the driving thin film transistor T1.

An operation control gate electrode of the operation control thin film transistor T5 may be connected to the emission control line EL, and an operation control source region of the operation control thin film transistor T5 may be connected to the driving voltage line PL, and an operation control drain region of the operation control thin film transistor T5 may be connected to the driving source region of the driving thin film transistor T1 and the switching drain region of the switching thin film transistor T2.

An emission control gate electrode of the emission control thin film transistor T6 may be connected to the emission control line EL, and an emission control source region of the emission control thin film transistor T6 may be connected to the driving drain region of the driving thin film transistor T1 and the compensation drain region of the compensation thin film transistor T3, and an emission control drain region of the emission control thin film transistor T6 may be electrically connected to a second initialization drain region of the second initialization thin film transistor T7 and the pixel electrode of the light emitting element LD.

The operation control thin film transistor T5 and the emission control thin film transistor T6 are simultaneously turned on according to the emission control signal En received through the emission control line EL and allow the driving voltage ELVDD to be applied to the light emitting element LD to allow the driving current ILD to flow through the light emitting element LD.

A second initialization gate electrode of the second initialization thin film transistor T7 may be connected to the next scan line SLn, and the second initialization drain region of the second initialization thin film transistor T7 may be connected to the emission control drain region of the emission control thin film transistor T6 and the pixel electrode of the light emitting element LD, and the second initialization source region of the second initialization thin film transistor T7 may be connected to the second initialization voltage line VL2 to receive an anode initialization voltage Aint. The second initialization thin film transistor T7 is turned on according to the next scan signal Sn+1 transmitted through the next scan line SLn and initializes the pixel electrode of the light emitting element LD.

In an embodiment, a second initialization thin film transistor T7 may be connected to an emission control line EL to be driven according to an emission control signal En. Positions of the source regions and the drain regions may be interchanged according to the types (p-type or n-type) of the transistors.

The storage capacitor Cst may include the first electrode CE1 and a second electrode CE2. The first electrode CE1 of the storage capacitor Cst is connected to the driving gate electrode of the driving thin film transistor T1, and the second electrode CE2 of the storage capacitor Cst is connected to the driving voltage line PL. The storage capacitor Cst may store an electric charge corresponding to a difference between a voltage of the driving gate electrode of the driving thin film transistor T1 and the driving voltage ELVDD.

A boosting capacitor Cbs may include a first electrode CE1' and a second electrode CE2'. The first electrode CE1' of the boosting capacitor Cbs may be connected to the first electrode CE1 of the storage capacitor Cst, and the second electrode CE2' of the boosting capacitor Cbs may receive the first scan signal Sn. The boosting capacitor Cbs may compensate for the voltage drop of a gate terminal of the driving thin film transistor T1 by increasing the voltage of the gate terminal at the point in time in case that the provision of the first scan signal Sn is stopped.

In this embodiment, at least one of the thin film transistors T1 to T7 may include a semiconductor layer including an oxide, and the others include semiconductor layers including silicon.

By way of example, the driving thin film transistor T1, which directly affects the brightness of a display device, may be formed to include a semiconductor layer made of polycrystalline silicon having high reliability, thereby realizing a high-resolution display device.

On the other hand, due to high carrier mobility and a low leakage current, the voltage drop of an oxide semiconductor is not large even in case that the driving time is long. For example, the oxide semiconductor is capable of low-frequency driving because the color change of an image caused by the voltage drop is not large even during the low-frequency driving.

As described above, because the oxide semiconductor has an advantage of a low leakage current, it is possible to prevent a leakage current that may flow into the driving gate electrode and simultaneously to reduce power consumption by employing the oxide semiconductor for at least one of the compensation thin film transistor T3, the first initialization thin film transistor T4, or the second initialization thin film transistor T7 connected to the driving gate electrode of the driving thin film transistor T1.

Figure 7A:
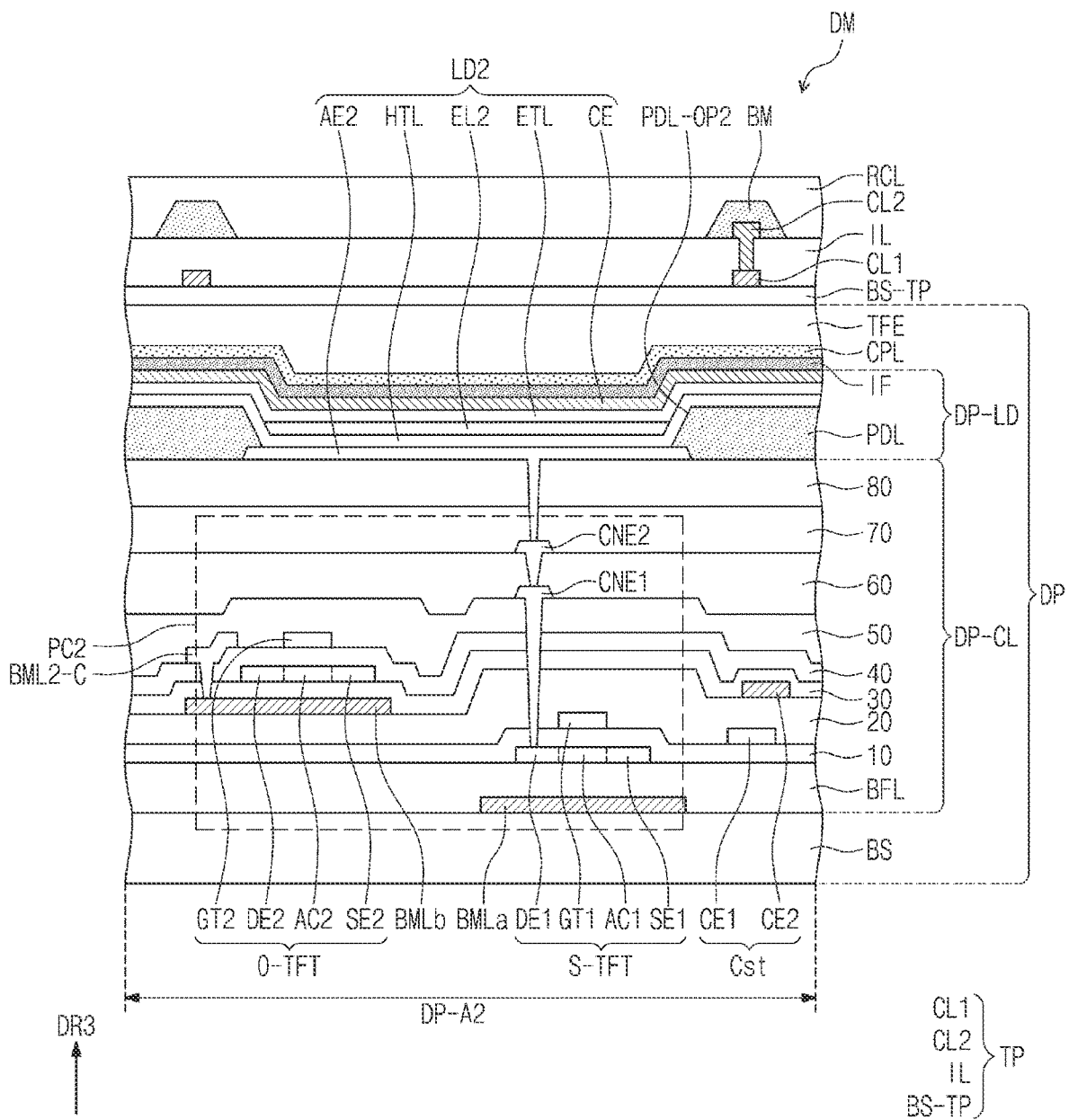
FIG. 7A is a schematic cross-sectional view of a display module according to an embodiment.
Figure 7B:
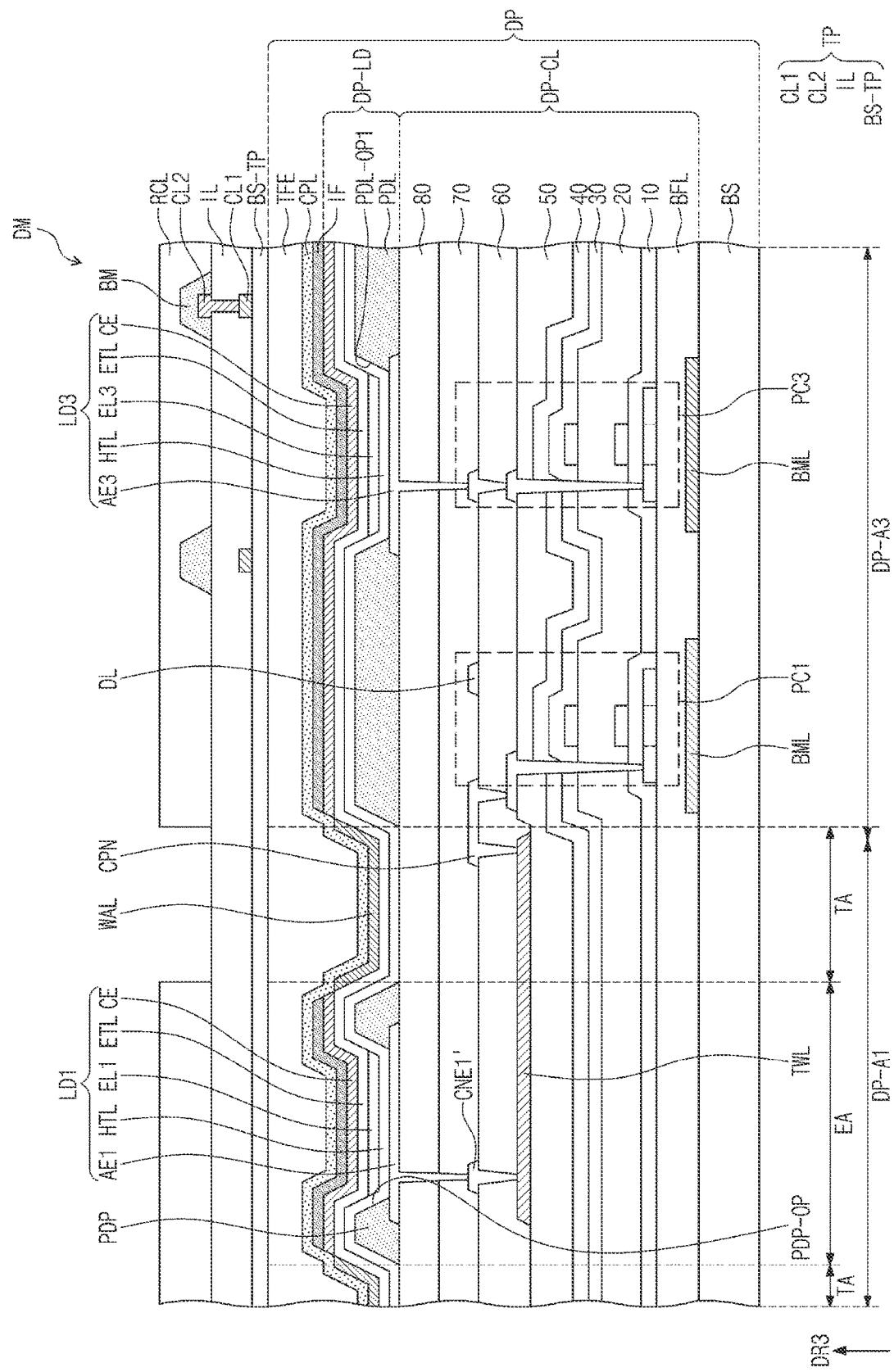
FIG. 7B is a schematic cross-sectional view of a display module according to an embodiment.

FIG. 7A is a schematic cross-sectional view of a display module according to an embodiment. FIG. 7B is a schematic cross-sectional view of a display module according to an embodiment. FIG. 7A is a schematic cross-sectional view of a portion including the second display area DP-A2, and FIG. 7B is a schematic cross-sectional view of a portion including the first display area DP-A1 and the third display area DP-A3.

The electronic device according to an embodiment may include the display module DM including the display panel DP and the reflection adjusting layer RCL. The display module DM according to an embodiment may include the sensor layer TP disposed between the display panel DP and the reflection adjusting layer RCL.

The display panel DP may be divided into the first to third display areas DP-A1, DP-A2, and DP-A3. The first display area DP-A1 may be divided into the element area EA and the transmissive area TA.

Referring to FIG. 7A and FIG. 7B, the display panel DP may include insulating layers, the semiconductor pattern, the conductive pattern, the signal line, and the like within the spirit and the scope of the disclosure. Each of the insulating layers, a semiconductor layer, and a conductive layer are formed in a method such as coating and deposition. Thereafter, the insulating layer, the semiconductor layer, and the conductive layer may be selectively patterned in a photolithography method. In these methods, the semiconductor pattern, the conductive pattern, the signal line, and the like included in the circuit layer DP-CL and the light emitting element layer DP-LD are formed. Thereafter, the encapsulation layer TFE covering or overlapping the light emitting element layer DP-LD may be formed. The inorganic absorption layer IF may be disposed between the light emitting element layer DP-LD and the encapsulation layer TFE.

The inorganic absorption layer IF may function to reduce reflected light generated by a common electrode CE included in the light emitting element layer DP-LD or another metal layer. The inorganic absorption layer IF may induce destructive interference between reflected light reflected from the common electrode CE and the like and directed toward an upper portion of the encapsulation layer TFE and reflected light reflected from the inorganic absorption layer IF and directed toward the upper portion of the encapsulation layer TFE, thereby allowing the display panel DP to implement low-reflection characteristics.

The inorganic absorption layer IF may be disposed in the second display area DP-A2 and the third display area DP-A3. The inorganic absorption layer IF may be disposed in the element area EA in the first display area DP-A1. In an embodiment, the inorganic absorption layer IF may overlap the element area EA of the display panel DP and may not overlap the transmissive area TA.

The inorganic absorption layer IF may include one metal or an alloy of metals. The inorganic absorption layer IF may have a refractive index n of about 1 or larger. An extinction coefficient k of the inorganic absorption layer IF may be about 5 or smaller. For example, the extinction coefficient k of the inorganic absorption layer IF may be in a range of about 0.5 to about 5.

The inorganic absorption layer IF may include a transition metal, a post-transition metal, a lanthanide metal, or an alloy of two or more metals selected therefrom. For example, the inorganic absorption layer IF may include bismuth (Bi), an alloy including Bi, ytterbium (Yb), an alloy including Yb, manganese (Mn), or an alloy including Mn.

The inorganic absorption layer IF may be provided on the common electrode CE by using a vacuum deposition method. In an embodiment, the inorganic absorption layer IF may be provided by being patterned so as not to be provided in a portion of the first display area DP-A1. The inorganic absorption layer IF may be patterned using a pattern layer WAL. In an embodiment, the adhesion between the pattern layer WAL and the inorganic absorption layer IF becomes noticeably low due to the influence of the surface properties of the pattern layer WAL, and accordingly, the inorganic absorption layer IF may be patterned so as not to be disposed on the pattern layer WAL.

The pattern layer WAL may include a fluorine-based compound. For example, the pattern layer WAL may include a compound including a functional group of —CF, —CF2, or —CF3.

For example, the pattern layer WAL may include a compound F given below. However, an embodiment is not limited thereto, and the pattern layer WAL may be formed to include a material that reduces adhesion between inorganic deposition layers and the pattern layer WAL.

[Compound F]

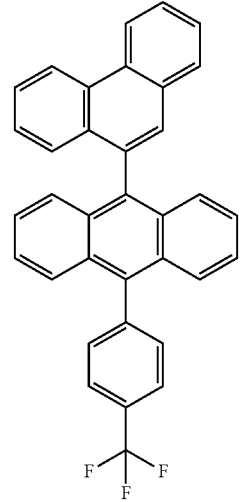

FIG. 7A illustrates the second light emitting element LD2 and a silicon thin film transistor S-TFT and an oxide thin film transistor O-TFT of the second pixel circuit PC2 (see FIG. 5). FIG. 7B illustrates the first light emitting element LD1, the first pixel circuit PC1, the third light emitting element LD3, and the third pixel circuit PC3.

Referring to FIG. 7A and FIG. 7B, a buffer layer BFL may be disposed on the base layer BS. The buffer layer BFL may prevent metal atoms or impurities from diffusing from the base layer BS to a first semiconductor pattern. The buffer layer BFL may control a heat supply rate during a crystallization process for forming the first semiconductor pattern, so that the first semiconductor pattern may be uniformly formed.

A first back metal layer BMLa may be disposed on a lower portion of the silicon thin film transistor S-TFT, and a second back metal layer BMLb may be disposed on a lower portion of the oxide thin film transistor O-TFT. The back metal layers BMLa and BMLb and a back metal layer BML may be disposed to overlap the first to third pixel circuits PC1, PC2, and PC3 to protect the first to third pixel circuits PC1, PC2, and PC3. The back metal layers BMLa, BMLb, and BML may block an electric potential due to the polarization of the base layer BS from affecting the first to third pixel circuits PC1, PC2, and PC3.

The first back metal layer BMLa may be disposed to correspond to at least a partial area of the pixel circuit PC (see FIG. 6). In an embodiment, the first back metal layer BMLa may be disposed to overlap the driving thin film transistor T1 (see FIG. 6) provided as the silicon thin film transistor S-TFT.

The first back metal layer BMLa may be disposed between the base layer BS and the buffer layer BFL. In an embodiment, the first back metal layer BMLa may be disposed on the base layer BS in which an organic film and an inorganic film may be alternately laminated, and an inorganic barrier layer may be further disposed between the first back metal layer BMLa and the buffer layer BFL. The first back metal layer BMLa may be connected to an electrode or a line to receive a constant voltage or a signal therefrom. In an embodiment, a first back metal layer BMLa may be provided in a form in which the first back metal layer BMLa is isolated from other electrodes or lines.

The second back metal layer BMLb may be disposed to correspond to the lower portion of the oxide thin film transistor O-TFT. The second back metal layer BMLb may be disposed between a second insulating layer 20 and a third insulating layer 30. The second back metal layer BMLb may be disposed on a same layer as the second electrode CE2 of the storage capacitor Cst. The second back metal layer BMLb may be connected to a contact electrode BML2-C to receive a constant voltage or a signal. The contact electrode BML2-C may be disposed on a same layer as a gate GT2 of the oxide thin film transistor O-TFT.

Each of the back metal layers BMLa, BMLb, and BML may include a reflective metal. For example, each of the back metal layers BMLa, BMLb, and BML may include silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), titanium (Ti), p+ doped amorphous silicon, and the like within the spirit and the scope of the disclosure. The back metal layers BMLa, BMLb, and BML may all include a same material or a similar material or may include different materials.

The first semiconductor pattern may be disposed on the buffer layer BFL. The first semiconductor pattern may include a silicon semiconductor. For example, the silicon semiconductor may include amorphous silicon, polycrystalline silicon (for example, polysilicon), or the like within the spirit and the scope of the disclosure. For example, the first semiconductor pattern may include low-temperature polysilicon.

FIG. 7A illustrates a portion of the first semiconductor pattern disposed on the buffer layer BFL, and the first semiconductor pattern may be further disposed in another area. The first semiconductor pattern may be arranged or disposed in a specific or given rule across the pixels. The first semiconductor pattern may have different electrical properties depending on whether the same is doped. The first semiconductor pattern may include a first region having high conductivity and a second region having low conductivity. The first region may be doped with an N-type dopant or a P-type dopant. A P-type transistor may include a doped region doped with the P-type dopant, and an N-type transistor may include a doped region doped with the N-type dopant. The second region may be a non-doped region or a region doped at a lower concentration than the first region.

The conductivity of the first region is higher than that of the second region, and the first region may substantially serve as an electrode or a signal line. The second region may substantially correspond to an active region (or a channel) of the transistor. In other words, a portion of the semiconductor pattern may be the active region of the transistor, another portion may be a source or drain region of the transistor, and another portion may be a connection electrode or a connection signal line.

A source region SE1, an active region AC1, and a drain region DE1 of the silicon thin film transistor S-TFT may be formed from the first semiconductor pattern. The source region SE1 and the drain region DE1 may respectively extend in opposite directions from the active region AC1 when viewed in a cross section.

A first insulating layer 10 may be disposed on the buffer layer BFL. The first insulating layer 10 may overlap the pixels in common and may cover or overlap the first semiconductor pattern. The first insulating layer 10 may be an inorganic layer and/or an organic layer and may have a single-layer or multilayer structure. The first insulating layer 10 may include at least one of aluminum oxide, titanium oxide, silicon oxide, silicon nitride, silicon oxynitride, zirconium oxide, or hafnium oxide. In an embodiment, the first insulating layer 10 may be a single-layer silicon oxide layer. In addition to the first insulating layer 10, each of insulating layers of the circuit layer DP-CL to be described later may be an inorganic layer and/or an organic layer and may have a single-layer or multilayer structure. The inorganic layer may include at least one of the above-described materials but is not limited thereto.

A gate GT1 of the silicon thin film transistor S-TFT is disposed on the first insulating layer 10. The gate GT1 may be a portion of a metal pattern. The gate GT1 overlaps the active region AC1. In a process of doping the first semiconductor pattern, the gate GT1 may function as a mask. The gate GT1 may include titanium (Ti), silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), indium tin oxide (ITO), indium zinc oxide (IZO), and the like, but the gate GT1 is not particularly limited thereto.

The second insulating layer 20 may be disposed on the first insulating layer 10 and may cover or overlap the gate GT1. The second insulating layer 20 may be an inorganic layer and/or an organic layer and may have a single-layer or multilayer structure. The second insulating layer 20 may include at least one of silicon oxide, silicon nitride, or silicon oxynitride. In this embodiment, the second insulating layer 20 may have a multilayer structure including a silicon oxide layer and a silicon nitride layer.

The third insulating layer 30 may be disposed on the second insulating layer 20. The third insulating layer 30 may have a single-layer or multilayer structure. For example, the third insulating layer 30 may have a multilayer structure including a silicon oxide layer and a silicon nitride layer. The second electrode CE2 of the storage capacitor Cst may be disposed between the second insulating layer 20 and the third insulating layer 30. The first electrode CE1 of the storage capacitor Cst may be disposed between the first insulating layer 10 and the second insulating layer 20.

A second semiconductor pattern may be disposed on the third insulating layer 30. The second semiconductor pattern may include an oxide semiconductor. The oxide semiconductor may include regions divided according to whether metal oxide is reduced. A region in which the metal oxide is reduced (hereinafter, referred to as a reduction region) has a higher conductivity than a region in which the metal oxide is not reduced (hereinafter, referred to as a non-reduction region). The reduction region substantially serves as a source or drain region of the transistor or a signal line. The non-reduction region substantially corresponds to an active region (or a semiconductor region or the channel) of the transistor. In other words, a portion of the second semiconductor pattern may be the active region of the transistor, another portion may be the source or drain region of the transistor, and another portion may be a signal transmission region.

A source region SE2, an active region AC2, and a drain region DE2 of the oxide thin film transistor O-TFT may be formed from the second semiconductor pattern. The source region SE2 and the drain region DE2 may respectively extend in opposite directions from the active region AC2 when viewed in a cross section.

A fourth insulating layer 40 may be disposed on the third insulating layer 30. The fourth insulating layer 40 may overlap the pixels in common and may cover or overlap the second semiconductor pattern. The fourth insulating layer 40 may include at least one of aluminum oxide, titanium oxide, silicon oxide, silicon nitride, silicon oxynitride, zirconium oxide, or hafnium oxide.

The gate GT2 of the oxide thin film transistor O-TFT is disposed on the fourth insulating layer 40. The gate GT2 may be a portion of a metal pattern. The gate GT2 overlaps the active region AC2. In a process of doping the second semiconductor pattern, the gate GT2 may function as a mask.

A fifth insulating layer 50 may be disposed on the fourth insulating layer 40 and may cover or overlap the gate GT2. The fifth insulating layer 50 may be an inorganic layer and/or an organic layer and may have a single-layer or multilayer structure.

A first connection electrode CNE1 and CNE1' may be disposed on the fifth insulating layer 50. Referring to FIG. 7A, the first connection electrode CNE1 may be connected to the drain region DE1 of the silicon thin film transistor S-TFT through a contact hole penetrating the first to fifth insulating layers 10, 20, 30, 40, and 50. And referring to FIG. 7B, the first connection electrode CNE1' may be electrically connected to the first pixel electrode AE1 and the connection line TWL.

A sixth insulating layer 60 may be disposed on the fifth insulating layer 50. A second connection electrode CNE2 may be disposed on the sixth insulating layer 60. The second connection electrode CNE2 may be connected to the first connection electrode CNE1 through a contact hole penetrating the sixth insulating layer 60. A seventh insulating layer 70 may be disposed on the sixth insulating layer 60 and may cover or overlap the second connection electrode CNE2. An eighth insulating layer 80 may be disposed on the seventh insulating layer 70.

Each of the sixth insulating layer 60, the seventh insulating layer 70, and the eighth insulating layer 80 may be an organic layer. For example, each of the sixth insulating layer 60, the seventh insulating layer 70, and the eighth insulating layer 80 may include a polymer material such as benzocyclobutene (BCB), polyimide, hexamethyldisiloxane (HMDSO), polymethylmethacrylate (PMMA), and polystyrene (PS), a polymer derivative having a phenol-based group, an acrylate-based polymer, an imide-based polymer, an arylether-based polymer, an amide-based polymer, a fluorine-based polymer, a p-xylene-based polymer, a vinyl alcohol-based polymer, a blend thereof, and the like within the spirit and the scope of the disclosure.

The light emitting element layer DP-LD including the first to third light emitting elements LD1, LD2, and LD3 may be disposed on the circuit layer DP-CL. Each of the first to third light emitting elements LD1, LD2, and LD3 may include a corresponding one of the first to third pixel electrodes AE1, AE2, and AE3, a hole transport layer HTL, a corresponding one of first to third light emitting layers EL1, EL2, and EL3, an electron transport layer ETL, and the common electrode CE. The common electrode CE may be connected to the pixels PX (see FIG. 4) and provided in common to all of the first to third light emitting elements LD1, LD2, and LD3. In an embodiment, the common electrode CE may be provided by being partially patterned to correspond to light emitting areas of the light emitting elements LD1, LD2, and LD3.

The first pixel electrode AE1, the second pixel electrode AE2, and the third pixel electrode AE3 may be disposed on the eighth insulating layer 80. Each of the first to third pixel electrodes AE1, AE2, and AE3 may be a transmissive electrode, a transflective electrode, or a reflective electrode. Each of the first to third pixel electrodes AE1, AE2, and AE3 may include at least one selected from Ag, Mg, Cu, Al, Pt, Pd, Au, Ni, Nd, Ir, Cr, Li, Ca, LiF, Mo, Ti, W, In, Sn, and Zn, a compound of two or more materials selected therefrom, a mixture of two or more materials selected therefrom, or oxide thereof.

In case that the pixel electrodes AE1, AE2, and AE3 are transmissive electrodes, each of the pixel electrodes AE1, AE2, and AE3 may include transparent metal oxide such as indium tin oxide (ITO), indium zinc oxide (IZO), zinc oxide (ZnO), and indium tin zinc oxide (ITZO). In case that the pixel electrodes AE1, AE2, and AE3 are transflective electrodes or reflective electrodes, each of the pixel electrodes AE1, AE2, and AE3 may include Ag, Mg, Cu, Al, Pt, Pd, Au, Ni, Nd, Ir, Cr, Li, Ca, LiF/Ca (a laminated structure of LiF and Ca), LiF/Al (a laminated structure of LiF and Al), Mo, Ti, W, or a compound or mixture thereof (for example, a mixture of Ag and Mg). For example, each of the pixel electrodes AE1, AE2, and AE3 may have a structure of layers including a reflective film or a transflective film formed of the above-described materials, and a transparent conductive film formed of indium tin oxide (ITO), indium zinc oxide (IZO), zinc oxide (ZnO), indium tin zinc oxide (ITZO), for example, within the spirit and the scope of the disclosure. For example, each of the pixel electrodes AE1, AE2, and AE3 may have a three-layer structure of ITO/Ag/ITO but is not limited thereto.

A pixel defining layer PDL and a pixel defining pattern PDP may be disposed on the eighth insulating layer 80. The pixel defining layer PDL and the pixel defining pattern PDP may include a same material or a similar material and may be formed through a same process. The pixel defining layer PDL and the pixel defining pattern PDP may be formed of an organic material. For example, the pixel defining layer PDL and the pixel defining pattern PDP may be formed by including polyimide.

In an embodiment, each of the pixel defining layer PDL and the pixel defining pattern PDP may have a property of absorbing light and may have, for example, a black color. Each of the pixel defining layer PDL and the pixel defining pattern PDP may include a black coloring agent. The black coloring agent may include a black dye or a black pigment. The black coloring agent may include carbon black, a metal such as chromium, or oxide thereof.

The pixel defining pattern PDP may be disposed in the first display area DP-A1. The pixel defining pattern PDP may cover or overlap a of the first pixel electrode AE1. For example, the pixel defining pattern PDP may cover or overlap an edge of the first pixel electrode AE1. The pixel defining pattern PDP may have a ring shape when viewed in a thickness direction of the display panel DP, for example, in a direction of the third direction axis DR3. An opening PDP-OP may be defined in the pixel defining pattern PDP, and a top surface of the first pixel electrode AE1 may be exposed in the opening PDP-OP.

The pixel defining layer PDL may be disposed in the second display area DP-A2 and the third display area DP-A3. The pixel defining layer PDL may cover or overlap a portion of each of the second pixel electrode AE2 and the third pixel electrode AE3. For example, a first opening PDL-OP1 exposing a portion of the third pixel electrode AE3 and a second opening PDL-OP2 exposing a portion of the second pixel electrode AE2 may be defined in the pixel defining layer PDL.

The pixel defining pattern PDP may increase a distance between the edge of the first pixel electrode AE1 and the common electrode CE, and the pixel defining layer PDL may increase a distance between the common electrode CE and an edge of each of the second and third pixel electrodes AE2 and AE3. Accordingly, the pixel defining pattern PDP and the pixel defining layer PDL may serve to prevent arcs from occurring at the edge of each of the first, second, and third pixel electrodes AE1, AE2, and AE3.

In the first display area DP-A1, an area overlapping a portion where the first pixel electrode AE1 and the pixel defining pattern PDP are disposed may be defined as the element area EA, and the remaining area may be defined as the transmissive area TA.

The first pixel electrode AE1 may be electrically connected to the first pixel circuit PC1 disposed in the third display area DP-A3. For example, the first pixel electrode AE1 may be electrically connected to the first pixel circuit PC1 through the connection line TWL and a connection bridge CPN. The connection line TWL may overlap the transmissive area TA. Accordingly, the connection line TWL may include a light-transmissive material.

The connection line TWL may be disposed between the fifth insulating layer 50 and the sixth insulating layer 60 but is not particularly limited thereto. The connection bridge CPN may be disposed between the sixth insulating layer 60 and the seventh insulating layer 70. The connection bridge CPN may be connected to the connection line TWL and the first pixel circuit PC1. The connection line TWL may be provided in plurality, and some or a number of the connection lines TWL may be disposed between the fifth insulating layer 50 and the sixth insulating layer 60, and the others thereof may be disposed between the sixth insulating layer 60 and the seventh insulating layer 70.

The first light emitting layer EL1 may be disposed on the first pixel electrode AE1, the second light emitting layer EL2 may be disposed on the second pixel electrode AE2, and the third light emitting layer EL3 may be disposed on the third pixel electrode AE3. In an embodiment, each of the first to third light emitting layers EL1, EL2, and EL3 may emit light of at least one of blue, red, or green.

The common electrode CE may be disposed on the first to third light emitting layers EL1, EL2, and EL3. In the second display area DP-A2, the common electrode CE may have an integral shape and may be disposed in common in the pixels PX (see FIG. 4).

In an embodiment, the common electrode CE may be patterned and provided in the first display area DP-A1. The common electrode CE may not be included in the transmissive area TA of the first display area DP-A1. In the first display area DP-A1, the common electrode CE may be disposed only in the element area EA. In the element area EA, the common electrode CE may face the first pixel electrode AE1 and may be disposed to overlap the light emitting layer EL1. The common electrode CE may be disposed to extend on the pixel defining pattern PDP. However, the common electrode CE may not be included in the transmissive area TA adjacent to the element area EA. The common electrode CE may be patterned using the pattern layer WAL.

The common electrode CE and the inorganic absorption layer IF may be simultaneously patterned by the pattern layer WAL. Accordingly, the display module DM of the embodiment illustrated in FIG. 7B, for example, may be manufactured using a process of patterning both the common electrode CE and the inorganic absorption layer IF using the pattern layer WAL, and thus the manufacturing process of the display module may be simplified.

The hole transport layer HTL may be disposed between the first to third pixel electrodes AE1, AE2, and AE3 and the first to third light emitting layers EL1, EL2, and EL3. The electron transport layer ETL may be disposed between the first to third light emitting layers EL1, EL2, and EL3 and the common electrode CE. The hole transport layer HTL and the electron transport layer ETL may be provided using an open mask and may be formed as common layers in the pixels PX (see FIG. 4). The hole transport layer HTL and the electron transport layer ETL may be provided as common layers in the entirety of the first to third display areas DP-A1, DP-A2, and DP-A3.

The hole transport layer HTL may include a phthalocyanine compound such as copper phthalocyanine, DNTPD (N1,N1'-([1,1'-biphenyl]-4,4'-diyl)bis(N1-phenyl-N4,N4-di-m-tolylbenzene-1,4-diamine)), m-MTDATA(4,4',4"-[tris (3-methylphenyl)phenylamino] triphenylamine), TDATA(4, 4'4"-Tris(N,N-diphenylamino)triphenylamine), 2-TNATA (4,4',4"-tris[N(2-naphthyl)-N-phenylamino]-triphenylamine), PEDOT/PSS(Poly(3,4-ethylenedioxythiophene)/Poly(4-styrenesulfonate)), PANI/DBSA(Polyaniline/Dodecylbenzenesulfonic acid), PANI/CSA(Polyaniline/Camphor sulfonic acid), PANI/PSS (Polyaniline/Poly(4-styrenesulfonate)), NPB(N,N'-di (naphthalene-1-yl)-N,N'-diphenyl-benzidine), polyether ketone including triphenylamine (TPAPEK), 4-Isopropyl-4'-methyldiphenyliodonium [Tetrakis(pentafluorophenyl)borate], HATCN (dipyrazino[2,3-f: 2',3'-h] quinoxaline-2,3,6, 7,10,11-hexacarbonitrile), and the like within the spirit and the scope of the disclosure.

The hole transport layer HTL may also include a carbazole-based derivative such as N-phenylcarbazole and polyvinylcarbazole, a fluorene-based derivative, TPD(N,N'-bis (3-methylphenyl)-N,N'-diphenyl-[1,1'-biphenyl]-4,4'-diamine), a triphenylamine-based derivative such as TCTA (4,4',4"-tris(N-carbazolyl)triphenylamine), NPB(N,N'-di (naphthalene-1-yl)-N,N'-diphenyl-benzidine), TAPC(4,4'-Cyclohexylidene bis[N,N-bis(4-methylphenyl)

benzenamine]), HMTPD(4,4'-Bis[N,N'-(3-tolyl)amino]-3,3'-dimethylbiphenyl), mCP(1,3-Bis(N-carbazolyl)benzene), and the like within the spirit and the scope of the disclosure.

The light emitting layers EL1, EL2, and EL3 may each include a fluorescent or phosphorescent material emitting light of red, green, or blue. The light emitting layers EL1, EL2, and EL3 may each include a metal organic complex as a light emitting material. Each of the light emitting layers EL1, EL2, and EL3 may also include quantum dots as a light emitting material.

The electron transport layer ETL may include an anthracene-based compound. However, the electron transport layer ETL is not limited thereto and may include, for example, Alq3(Tris(8-hydroxyquinolinato)aluminum), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, TPBi(1,3,5-Tri(1-phenyl-1H-benzo[d]imidazol-2-yl)benzene), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminum), Bebq2(berylliumbis(benzoquinolin-10-olate)), ADN(9,10-di(naphthalene-2-yl)anthracene), BmPyPhB(1,3-Bis[3,5-di(pyridin-3-yl)phenyl]benzene), TSPO1(diphenyl(4-(triphenylsilyl)phenyl)phosphine oxide), and a mixture thereof.

The common electrode CE may include at least one selected from Ag, Mg, Cu, Al, Pt, Pd, Au, Ni, Nd, Ir, Cr, Li, Ca, LiF, Mo, Ti, W, In, Sn, and Zn, a compound of two or more materials selected therefrom, a mixture of two or more materials selected therefrom, or oxide thereof.

The common electrode CE may be a transmissive electrode, a transflective electrode, or a reflective electrode. In case that the common electrode CE is the transmissive electrode, the common electrode CE may be formed of transparent metal oxide such as indium tin oxide (ITO), indium zinc oxide (IZO), zinc oxide (ZnO), and indium tin zinc oxide (ITZO).

In case that the common electrode CE is the transflective electrode or the reflective electrode, the common electrode CE may include Ag, Mg, Cu, Al, Pt, Pd, Au, Ni, Nd, Ir, Cr, Li, Ca, LiF/Ca (a laminated structure of LiF and Ca), LiF/Al (a laminated structure of LiF and Al), Mo, Ti, Yb, W, or a compound or mixture including the same (for example, AgMg, AgYb, or MgYb). For example, the common electrode CE may have a structure of layers including a reflective film or a transflective film formed of the above-described materials, and a transparent conductive film formed of indium tin oxide (ITO), indium zinc oxide (IZO), zinc oxide (ZnO), indium tin zinc oxide (ITZO), or the like within the spirit and the scope of the disclosure. For example, the common electrode CE may include the aforementioned metal material, a combination of two or more metal materials selected from the aforementioned metal materials, oxide of the aforementioned metal materials, or the like within the spirit and the scope of the disclosure.

The display panel DP according to an embodiment may further include a capping layer CPL disposed on an upper or lower portion of the inorganic absorption layer IF. The capping layer CPL may include multiple layers or a single layer.

In an embodiment, the capping layer CPL may be an organic layer or an inorganic layer. For example, in case that the capping layer CPL may include an inorganic material, the inorganic material may include an alkali metal compound such as LiF, an alkaline earth metal compound such as MgF2, SiON, SiNX, SiOy, and the like within the spirit and the scope of the disclosure.

For example, in case that the capping layer CPL may include an organic material, the organic material may include α-NPD, NPB, TPD, m-MTDATA, Alq3, CuPc, TPD15(N4,N4,N4',N4'-tetra (biphenyl-4-yl) biphenyl-4,4'-diamine), TCTA(4,4',4"-Tris (carbazol sol-9-yl) triphenylamine), for example, or may include epoxy resin or acrylate such as methacrylate.

Referring to FIG. 7A and FIG. 7B, the capping layer CPL may be disposed on the inorganic absorption layer IF. In an embodiment, the capping layer CPL may be provided as a common layer in the entirety of the first to third display areas DP-A1, DP-A2, and DP-A3.

In the element area EA, the capping layer CPL may be disposed on the inorganic absorption layer IF, and in the transmissive area TA, the capping layer CPL may be disposed on the pattern layer WAL. For example, the capping layer CPL may be disposed on or directly disposed on the inorganic absorption layer IF in the element area EA and may be disposed on or directly disposed on the pattern layer WAL in the transmissive area TA. The capping layer CPL may be disposed to cover or overlap the inorganic absorption layer IF and the pattern layer WAL.

The encapsulation layer TFE may be disposed on the light emitting element layer DP-LD. The encapsulation layer TFE may include a structure of an inorganic layer/an organic layer/an inorganic layer sequentially laminated, but layers constituting the encapsulation layer TFE are not limited thereto.

The inorganic layers of the encapsulation layer TFE may protect the light emitting element layer DP-LD from moisture and oxygen, and the organic layer thereof may protect the light emitting element layer DP-LD from foreign matter such as dust particles. The inorganic layers may include a silicon nitride layer, a silicon oxynitride layer, a silicon oxide layer, a titanium oxide layer, an aluminum oxide layer, or the like within the spirit and the scope of the disclosure. The organic layer may include an acrylate-based organic layer but is not limited thereto.

In an embodiment, the sensor layer TP may be disposed on the display panel DP. The sensor layer TP may be referred to as a sensor, an input sensing layer, or an input sensing panel. The sensor layer TP may include a sensing base layer BS-TP, a first conductive layer CL1, a sensing insulating layer IL, and a second conductive layer CL2.

The sensing base layer BS-TP may be disposed on or directly disposed on the display panel DP. The sensing base layer BS-TP may be an inorganic layer including at least one of silicon nitride, silicon oxynitride, or silicon oxide. For example, the sensing base layer BS-TP may also be an organic layer including epoxy resin, acrylic resin, or imide-based resin. The sensing base layer BS-TP may have a single-layer structure, or a multilayer structure laminated in the direction of the third direction axis DR3.

Each of the first conductive layer CL1 and the second conductive layer CL2 may have a single-layer structure or may have a multilayer structure laminated in the direction of the third direction axis DR3. The conductive layer of the single-layer structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), zinc peroxide (ZnO2), and indium zinc tin oxide (IZTO). The transparent conductive layer may include a conductive polymer such as PEDOT, metal nanowires, graphene, and the like within the spirit and the scope of the disclosure.

The conductive layer of the multilayer structure may include metal layers. The metal layers may have, for example, a three-layer structure of titanium/aluminum/titanium. The conductive layer of the multilayer structure may include at least one metal layer and at least one transparent conductive layer.

The sensing insulating layer IL may be disposed between the first conductive layer CL1 and the second conductive layer CL2. The sensing insulating layer IL may include an inorganic film. The inorganic film may include at least one of aluminum oxide, titanium oxide, silicon oxide, silicon nitride, silicon oxynitride, zirconium oxide, or hafnium oxide.

For example, the sensing insulating layer IL may include an organic film. The organic film may include at least one of acrylate-based resin, methacrylate-based resin, polyisoprene, vinyl-based resin, epoxy-based resin, urethane-based resin, cellulose-based resin, siloxane-based resin, polyimide-based resin, polyamide-based resin, or perylene-based resin.

In an embodiment, the reflection adjusting layer RCL may be disposed on the sensor layer TP. The reflection adjusting layer RCL may further include the division layer BM.

A material constituting the division layer BM is not particularly limited as long as the material absorbs light. The division layer BM may be a layer having a black color and may include, in an embodiment, a black coloring agent. The black coloring agent may include a black dye or a black pigment. The black coloring agent may include carbon black, a metal such as chromium, or oxide thereof.

The division layer BM may cover or overlap the second conductive layer CL2 of the sensor layer TP. The division layer BM may prevent reflection of external light by the second conductive layer CL2. The division layer BM may overlap the second display area DP-A2 and the third display area DP-A3 and may not overlap the first display area DP-A1. For example, a portion of the division layer BM overlapping the first display area DP-A1 may be removed. Accordingly, transmittance in the first display area DP-A1 may be further improved.

The reflection adjusting layer RCL may be disposed in the first display area DP-A1, the second display area DP-A2, and the third display area DP-A3. In an embodiment, the reflection adjusting layer RCL may not be disposed in the transmissive area TA.

The electronic device of an embodiment may include the inorganic absorption layer disposed on the light emitting element layer and the reflection adjusting layer disposed on the inorganic absorption layer, thereby exhibiting a characteristic of reduced degree of reflection by reflected light. The electronic device of an embodiment may include a structure in which the inorganic absorption layer and the reflection adjusting layer are patterned to be removed in a partial area, thereby exhibiting an improved transmittance characteristic. The electronic device of an embodiment may include a structure of the display module in which the inorganic absorption layer and the reflection adjusting layer are removed in a partial area overlapping the electronic module, so that the electronic device may exhibit an effect of improving the sensitivity of the electronic module.

FIGS. 8 to 11 below are schematic cross-sectional views of display modules according to embodiments. In case that embodiments are described with reference to FIGS. 8 to 11, a description overlapping with the description given with reference to FIGS. 1 to 7B will not be repeated, and differences will be described.

Figure 9:
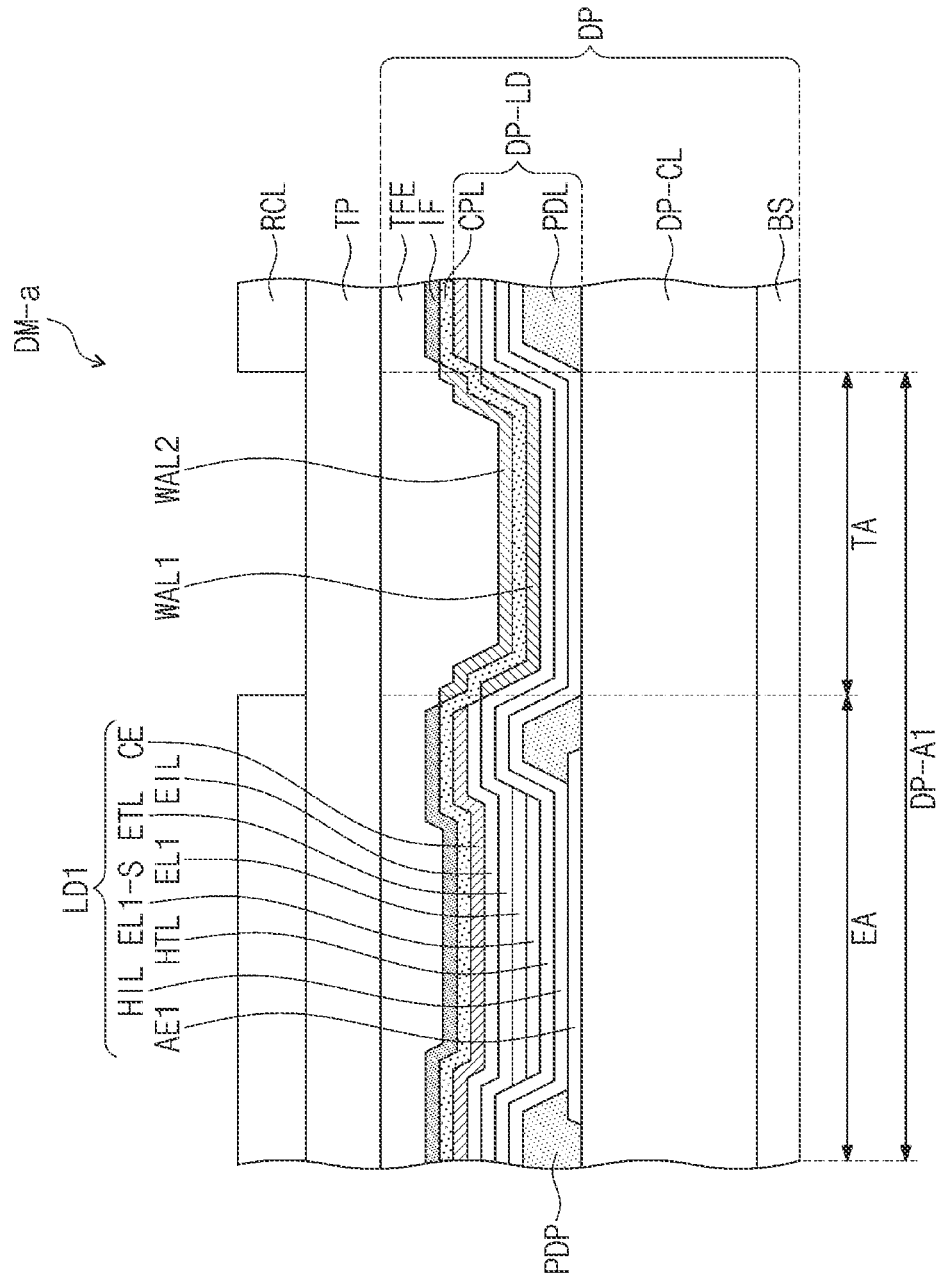
FIG. 9 is a schematic cross-sectional view of a display module according to an embodiment.
Figure 10:
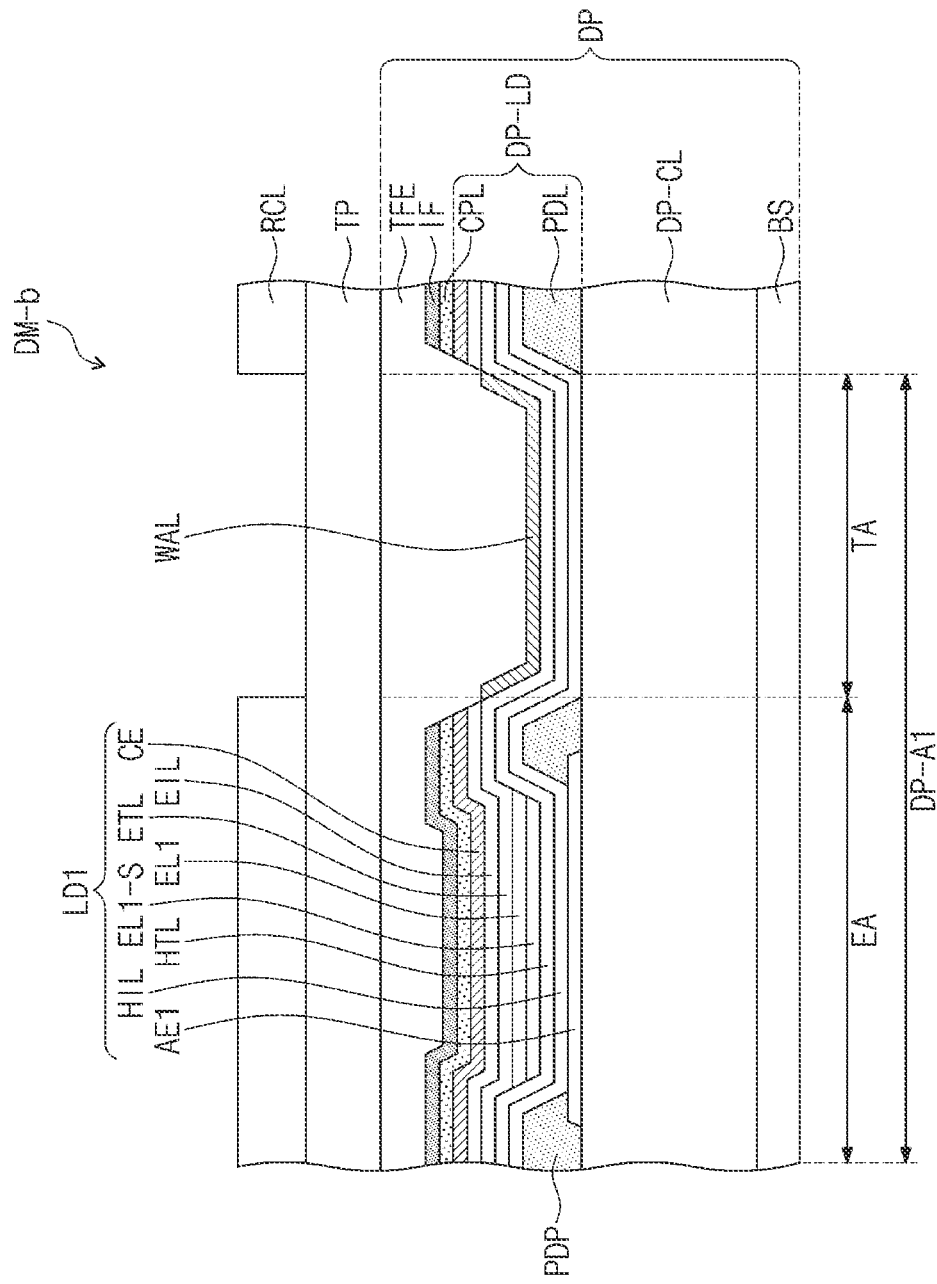
FIG. 10 is a schematic cross-sectional view of a display module according to an embodiment.

FIGS. 8 to 10 illustrate portions of the display modules corresponding to first display areas, and each of circuit layers and sensor layers is illustrated as a single layer, but the structures described above and illustrated in FIG. 7A and FIG. 7B may be equally applied.

FIG. 8 is the schematic cross-sectional view of the display module according to the embodiment. FIG. 8 illustrates a portion of a display module DM corresponding to a first display area DP-A1. The display module DM according to the embodiment illustrated in FIG. 8 differs from the display module DM according to the embodiment illustrated in FIG. 7B in that the display module DM illustrated in FIG. 8 further may include a hole injection layer HIL and an electron injection layer EIL in a light emitting element LD1. In an embodiment illustrated in FIG. 8, the light emitting element LD1 may further include an auxiliary light emitting layer EL1-S.

The light emitting element LD1 may further include the hole injection layer HIL disposed between a first pixel electrode AE1 and a hole transport layer HTL, the electron injection layer EIL disposed between an electron transport layer ETL and a common electrode CE, and the auxiliary light emitting layer EL1-S disposed on a lower portion of a light emitting layer EL1. The auxiliary light emitting layer EL1-S may be omitted in an embodiment. The hole injection layer HIL and the hole transport layer HTL may also be provided as a hole transport region of a single layer. The light emitting element LD1 may further include a component such as an electron blocking layer disposed on the hole transport layer HTL.

The auxiliary light emitting layer EL1-S may be provided to have a different thickness depending on the wavelength of light emitted by the light emitting layer EL1, and a resonance distance in the light emitting element LD1 may be adjusted by disposing the auxiliary light emitting layer EL1-S. The light emitting element LD1 may increase the color purity of light emitted from the light emitting layer EL1 by further including the auxiliary light emitting layer EL1-S.

The hole injection layer HIL may include an organic material used in the hole transport layer HTL described above. The hole injection layer HIL may select and include an organic material different from that of the hole transport layer HTL among the organic materials used in the hole transport layer HTL described above.

The electron injection layer EIL may include a metal halide such as LiF, NaCl, CsF, RbCl, RbI, CuI, and KI, a lanthanide metal such as Yb, and a co-deposition material of the metal halide and the lanthanide metal. For example, the electron injection layer EIL may include KI:Yb, RbI:Yb, for example, as the co-deposition material. Metal oxide such as $Li_2O$ and BaO, 8-hydroxyl-Lithium quinolate (Liq), or the like may be used for the electron injection layer EIL, but an embodiment is not limited thereto. The electron injection layer EIL may also be formed of a material in which an electron transport material and an insulating organo metal salt are mixed. The organo metal salt may be a material having an energy band gap of about 4 eV or larger. By way of example, the organo metal salt may include, for example, metal acetate, metal benzoate, metal acetoacetate, metal acetylacetonate, or metal stearate. The electron injection layer EIL may include a metal material that does not readily adhere to a pattern layer WAL including a fluorine-based compound.

In an embodiment, the hole injection layer HIL, the hole transport layer HTL, and the electron transport layer ETL may be provided as common layers in an element area EA and a transmissive area TA. The electron injection layer EIL may be disposed in the element area EA and may not be disposed in the transmissive area TA. The electron injection layer EIL may not overlap the pattern layer WAL.

In an embodiment, the electron injection layer EIL, the common electrode CE, and an inorganic absorption layer IF may not overlap the pattern layer WAL. A capping layer CPL may be disposed on the inorganic absorption layer IF and may be disposed to cover or overlap the inorganic absorption layer IF and the pattern layer WAL. In the embodiment illustrated in FIG. 8, the pattern layer WAL may be disposed on the electron transport layer ETL and may be disposed on a same layer as the electron injection layer EIL.

FIG. 9 is the schematic cross-sectional view of the display module according to an embodiment. In case that a display module DM-a according to an embodiment illustrated in FIG. 9 is compared with the display module DM according to an embodiment illustrated in FIG. 8, there is a difference in that the display module DM-a further may include an upper pattern layer WAL2 in a display panel DP and may have a capping layer CPL disposed on a lower portion of an inorganic absorption layer IF.

In an embodiment, the capping layer CPL may be disposed on the lower portion of the inorganic absorption layer IF. The capping layer CPL may be provided as a common layer in both an element area EA and a transmissive area TA. In the element area EA, the capping layer CPL may be disposed between a common electrode CE and the inorganic absorption layer IF.

The transmissive area TA of the display panel DP may include a pattern layer WAL1 disposed on an electron transport layer ETL, the capping layer CPL disposed on the pattern layer WAL1, and the upper pattern layer WAL2 disposed on the capping layer CPL. The transmissive area TA of the display panel DP may not include the common electrode CE and the inorganic absorption layer IF.

In the embodiment illustrated in FIG. 9, the upper pattern layer WAL2 may include a fluorine-based compound. For example, the upper pattern layer WAL2 may be formed of a same material or a similar material as the pattern layer WAL1.

In the display module DM-a according to an embodiment, the transmissive area TA may include the pattern layer WAL1, and an electron injection layer EIL and the common electrode CE may be patterned by the pattern layer WAL1. The electron injection layer EIL and the common electrode CE may be formed not to overlap the pattern layer WAL1. In the display module DM-a according to an embodiment, the transmissive area TA may include the upper pattern layer WAL2, and the inorganic absorption layer IF may be patterned by the upper pattern layer WAL2. The inorganic absorption layer IF may be formed not to overlap the upper pattern layer WAL2.

In the display module DM-a of the embodiment illustrated in FIG. 9, the inorganic absorption layer IF is disposed on the capping layer CPL, so that the reflectance reduction effect may be further improved.

FIG. 10 is the schematic cross-sectional view of the display module according to the embodiment. In case that a display module DM-b according to an embodiment illustrated in FIG. 10 is compared with the display module DM according to an embodiment illustrated in FIG. 8, there is a difference in that a capping layer CPL may not be disposed in a transmissive area TA of a display panel DP of the display module DM-b. In case that an embodiment illustrated in FIG. 10 is compared with an embodiment illustrated in FIG. 8, there is a difference in that the capping layer CPL may be disposed on a lower portion of an inorganic absorption layer IF in an embodiment illustrated in FIG. 10.

Referring to FIG. 10, the display module DM-b according to an embodiment may include the inorganic absorption layer IF and the capping layer CPL that do not overlap the transmissive area TA of the display panel DP. The inorganic absorption layer IF and the capping layer CPL may not overlap a pattern layer WAL.

In the display module DM-b according to an embodiment, a common electrode CE, the capping layer CPL, and the inorganic absorption layer IF may be formed by being patterned using the pattern layer WAL. The display module DM-b according to an embodiment may have a structure in which both the capping layer CPL and the inorganic absorption layer IF are removed from the transmissive area TA, thereby exhibiting further improved transmittance characteristics.

Although the capping layer CPL is illustrated in FIG. 10 as being disposed on the lower portion of the inorganic absorption layer IF, an embodiment is not limited thereto, and the capping layer CPL may be disposed on the inorganic absorption layer IF and may be provided by being patterned so as not to overlap the pattern layer WAL.

Figure 11:
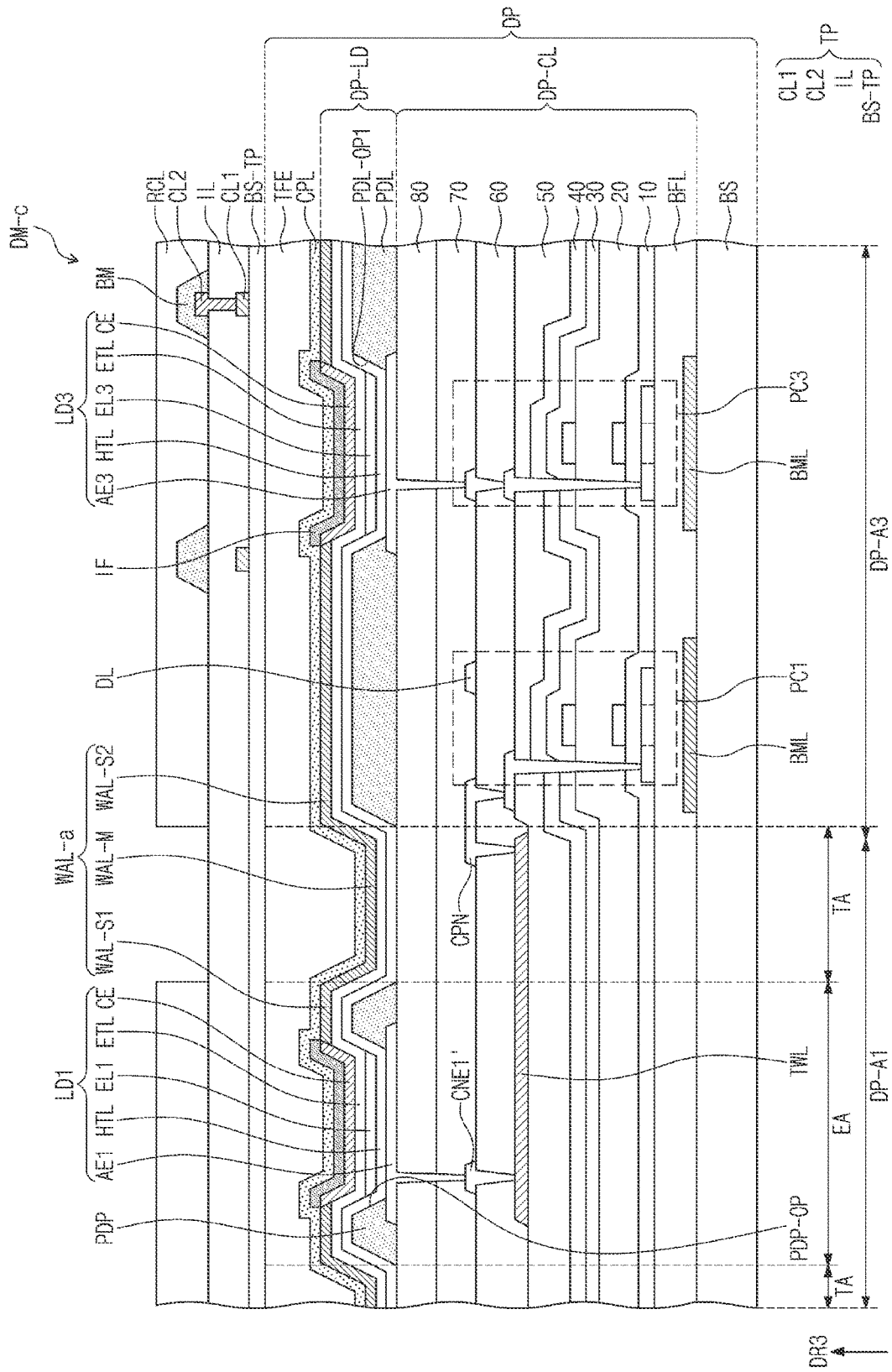
FIG. 11 is a schematic cross-sectional view of a display module according to an embodiment.

FIG. 11 is the schematic cross-sectional view of the display module according to the embodiment. FIG. 11 illustrates a portion of the display module including a first display area DP-A1 and a third display area DP-A3.

Referring to FIG. 11, in case that a display module DM-c according to an embodiment is compared with the display module DM according to an embodiment illustrated in FIG. 7B, there is a difference in that the display module DM-c may include a pattern layer WAL-a disposed to extend on a pixel defining pattern PDP or a pixel defining layer PDL.

In case that compared with an embodiment illustrated in FIG. 7B, the display module DM-c of the embodiment illustrated in FIG. 11 may include the pattern layer WAL-a having a main pattern layer WAL-M disposed in a transmissive area TA and an auxiliary pattern layer WAL-S1 and WAL-S2 extending from the main pattern layer WAL-M and overlapping the pixel defining pattern PDP or the pixel defining layer PDL. The main pattern layer WAL-M and the auxiliary pattern layer WAL-S1 and WAL-S2 may be formed including a fluorine-based compound. The main pattern layer WAL-M and the auxiliary pattern layer WAL-S1 and WAL-S2 may be formed of a same material or a similar material and may be formed in an integral shape.

In an embodiment, a common electrode CE and an inorganic absorption layer IF may not overlap the main pattern layer WAL-M and the auxiliary pattern layer WAL-S1 and WAL-S2. The pattern layer WAL-a further including the auxiliary pattern layer WAL-S1 and WAL-S2 may allow the common electrode CE and the inorganic absorption layer IF to be provided by being patterned so as not to overlap the pixel defining pattern PDP or the pixel defining layer PDL.

Although not illustrated, an electron injection layer EIL (see FIG. 8) may be further included in light emitting elements LD1 and LD3 and may also be provided by being patterned so as not to overlap the pattern layer WAL-a.

Table 1 below shows comparison results of display quality characteristics of the electronic device of an embodiment and an electronic device of a comparative example. Table 1 compares and shows current efficiency for white light, SCI reflectance, and color coordinates of a reflection color.

In Table 1, the comparative example corresponds to a structure of an electronic device in which the electronic device does not include components corresponding to the reflection adjusting layer and the inorganic absorption layer of the embodiment and may include a polarizing plate on a sensor layer. The embodiment of Table 1 corresponds to a structure of the electronic device having the structure of the first display area illustrated in FIG. 9.

TABLE 1

| Item | Comparative Example | Embodiment |
| --- | --- | --- |
| White Efficiency | 100% | 125% |
| SCI Reflectance | 4.8% | 5.3% |
| Reflection Color | $-2 \leq a^* \leq 2$ | $a^* = 0.9$ |
|  | $-1.5 \leq b^* \leq 0.5$ | $b^* = -0.6$ |

Referring to the results of Table 1, in case that the white efficiency of the comparative example is set to 100%, the embodiment exhibits an improved current efficiency characteristic compared with the comparative example. Thus, in case that compared with the comparative example, the embodiment may be confirmed to exhibit display quality of improved light efficiency as the embodiment may have an improved transmittance characteristic in the first display area.

The embodiment using the reflection adjusting layer and the inorganic absorption layer as an anti-reflection member has a level of the SCI reflectance similar to that of the comparative example using the polarizing plate as an anti-reflection member. For the reflection color, the embodiment has values of color coordinates that are included in the range of color coordinates specification of the reflection color.

Accordingly, the electronic device of the embodiment uses the reflection adjusting layer and the inorganic absorption layer as an anti-reflection member to exhibit good low-reflection characteristics, and at the same time, exhibits excellent current efficiency characteristics by including a display panel structure in which the inorganic absorption layer and the like are removed in a portion of the display area, so that the electronic device may have improved display quality.

Figure 12:
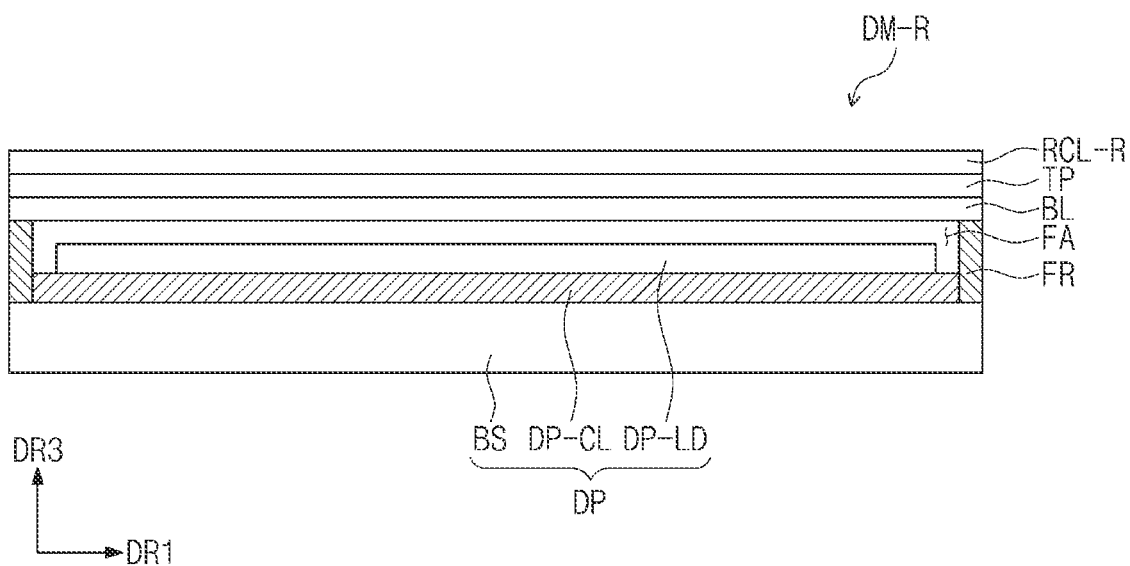
FIG. 12 is a schematic cross-sectional view of a display module according to an embodiment.
Figure 13:
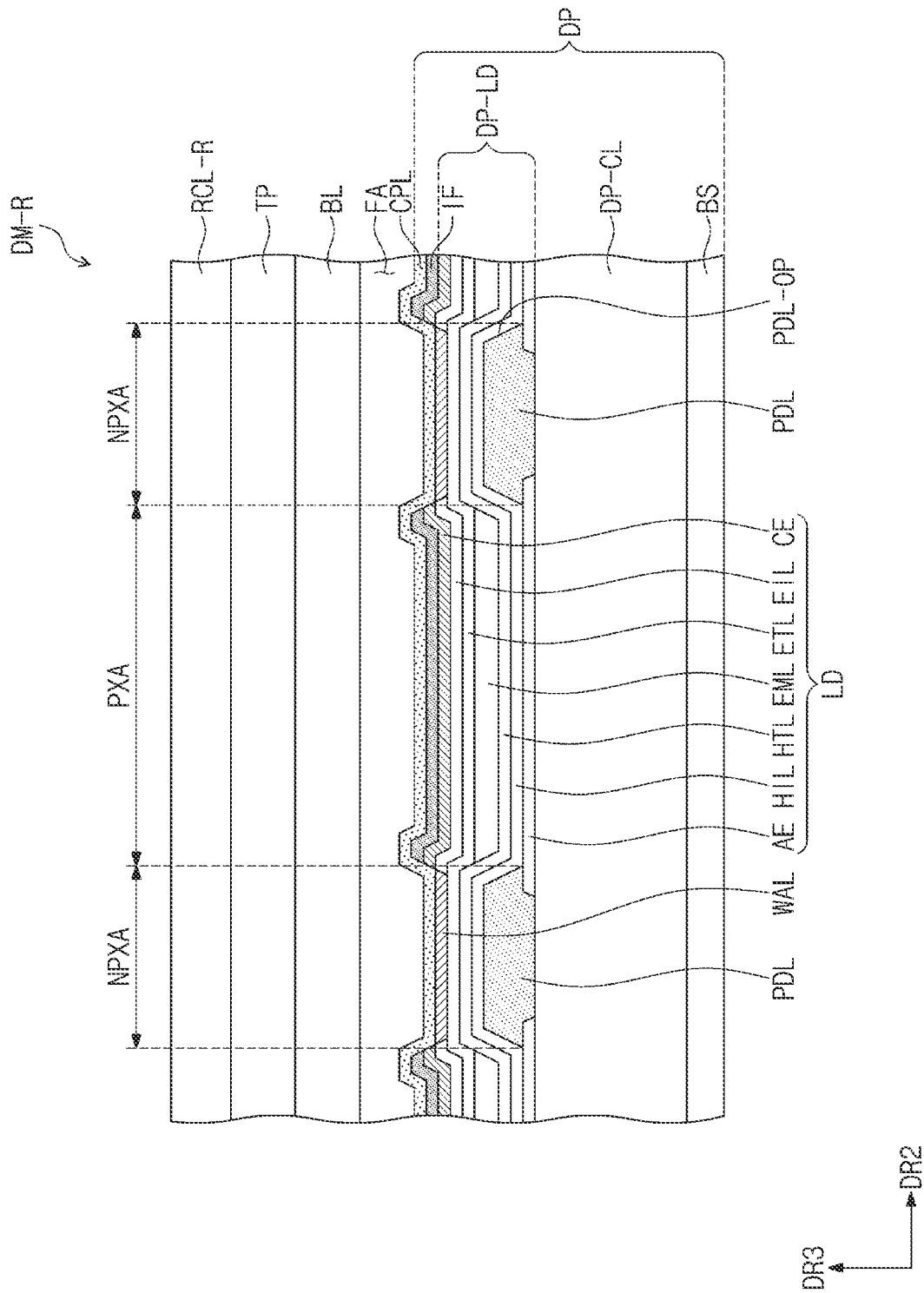
FIG. 13 is a schematic cross-sectional view of a display module according to an embodiment.
Figure 14:
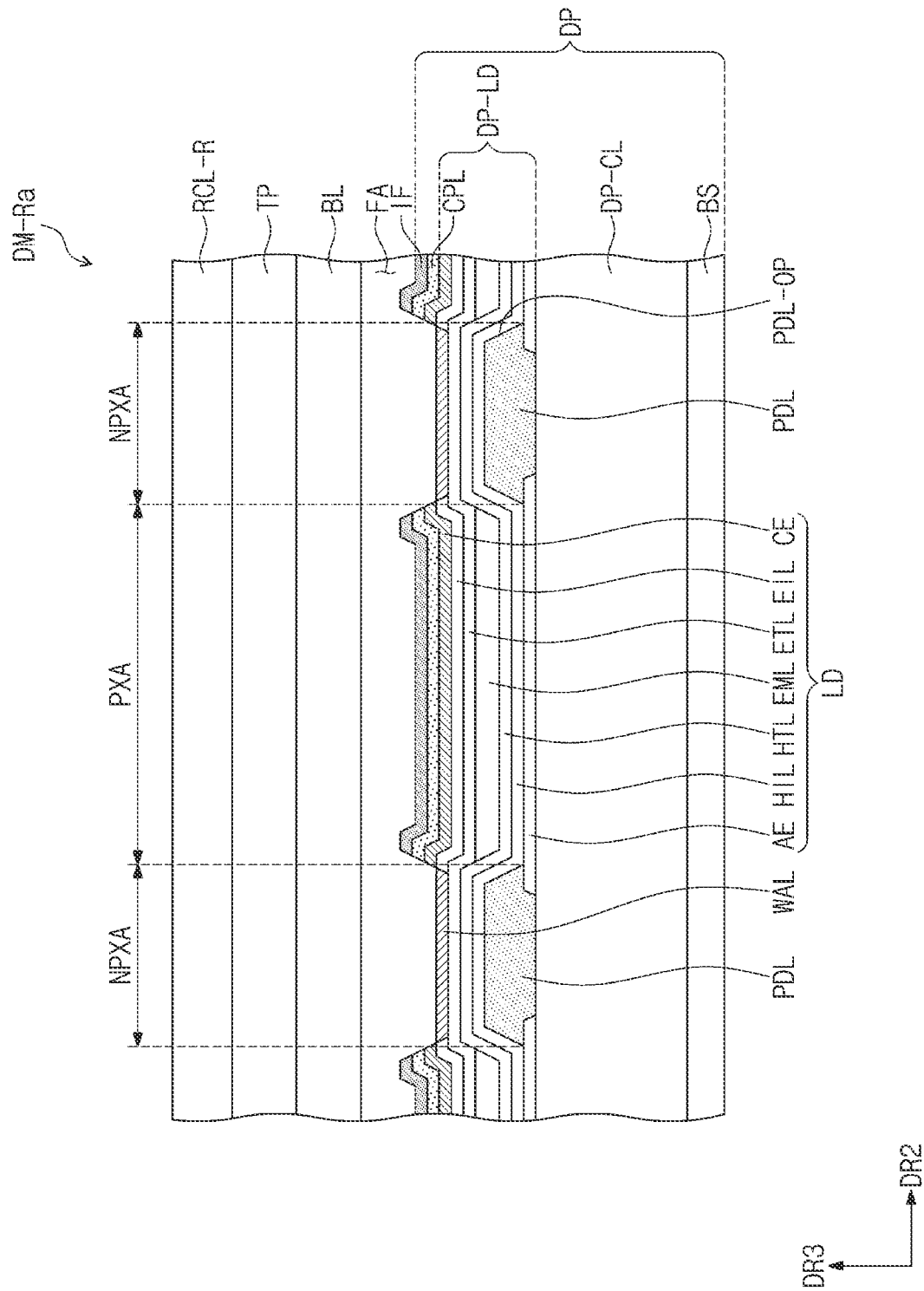
FIG. 14 is a schematic cross-sectional view of a display module according to an embodiment.

FIGS. 12 to 14 illustrate display modules according to embodiments included in electronic devices according to embodiments. In case that a description is given with reference to FIGS. 12 to 14, a description overlapping with that given with reference to FIGS. 1 to 11 will not be repeated, and differences will be described.

Referring to FIG. 12, a display module DM-R according to an embodiment may include a display panel DP, an encapsulation substrate BL, a sensor layer TP, and a reflection adjusting layer RCL-R.

In case that the display module DM-R of an embodiment illustrated in FIG. 12 is compared with the display module DM of an embodiment illustrated in FIG. 3, there is a difference in that the display module DM-R may include, instead of the encapsulation layer TFE disposed on the light emitting element layer DP-LD, the encapsulation substrate BL spaced apart from the display panel DP to be disposed above the display panel DP.

The encapsulation substrate BL may be a separate member that seals a light emitting element layer DP-LD of the display panel DP. For example, the encapsulation substrate BL may be a glass substrate.

A base layer BS of the display panel DP and the encapsulation substrate BL may be bonded by an encapsulation part FR. The encapsulation part FR may include a glass frit. The encapsulation part FR may further include at least one inorganic material. The encapsulation part FR may be disposed between the base layer BS and the encapsulation substrate BL and may be disposed along an edge of each of the base layer BS and the encapsulation substrate BL. A space between the display panel DP and the encapsulation substrate BL may be sealed by the encapsulation part FR.

A space FA sealed by the encapsulation part FR may be in a vacuum state. For example, the sealed space FA may be filled with N2, which is an inert gas, or may be filled with an insulating material.

The sensor layer TP may be disposed on the encapsulation substrate BL. The sensor layer TP may be provided on the encapsulation substrate BL as a separate member.

The display module DM-R according to an embodiment may include the reflection adjusting layer RCL-R disposed on the sensor layer TP. The display module DM-R according to an embodiment may include an inorganic absorption layer in the display panel DP although the inorganic absorption layer is not illustrated in FIG. 12, and the display module DM-R including both the inorganic absorption layer and the reflection adjusting layer may exhibit characteristics of reducing reflected light generated by external light or by metal layers inside the display panel.

FIG. 13 is a schematic cross-sectional view illustrating the display module according to the embodiment. The display module DM-R may include the display panel DP including the base layer BS, a circuit layer DP-CL, and the light emitting element layer DP-LD. The display panel DP may include an inorganic absorption layer IF and a capping layer CPL.

In an embodiment, the display module DM-R may include a light emitting area PXA and a non-light emitting area NPXA. The light emitting area PXA may be an area in which light emitted from a light emitting element LD is emitted. The non-light emitting area NPXA may be disposed to surround the light emitting area PXA. The light emitting area PXA may be provided in plurality. The non-light emitting area NPXA may be disposed between neighboring light emitting areas PXA.

The circuit layer DP-CL may be disposed on the base layer BS. The circuit layer DP-CL may include an insulating layer, a semiconductor pattern, a conductive pattern, a signal line, and the like within the spirit and the scope of the disclosure. The insulating layer, a semiconductor layer, and a conductive layer may be formed on the base layer BS in a method such as coating and deposition, and thereafter, the insulating layer, the semiconductor layer, and the conductive layer may be selectively patterned through a number of times of a photolithography process. Thereafter, the semiconductor pattern, the conductive pattern, and the signal line included in the circuit layer DP-CL may be formed.

The insulating layer may be provided in plurality. In an embodiment, the circuit layer DP-CL may include a transistor, a buffer layer, and the insulating layers. A pixel electrode AE may be electrically connected to a component of the circuit layer DP-CL.

The light emitting element layer DP-LD including the light emitting element LD is disposed on the circuit layer DP-CL. The light emitting element layer DP-LD may include a pixel defining layer PDL and the light emitting element LD.

The light emitting element LD may include the pixel electrode AE, a light emitting layer EML, and a common electrode CE. The light emitting element LD may further include a hole injection layer HIL, a hole transport layer HTL, an electron transport layer ETL, and an electron injection layer EIL.

An opening PDL-OP may be defined in the pixel defining layer PDL, and the opening PDL-OP exposes at least a portion of the pixel electrode AE. In this embodiment, the light emitting area PXA is defined to correspond to the portion of the pixel electrode AE exposed by the opening PDL-OP. The non-light emitting area NPXA may surround the light emitting area PXA.

In an embodiment, the pixel defining layer PDL may have a property of absorbing light and may have, for example, a black color. The pixel defining layer PDL may include a black coloring agent. The black coloring agent may include a black dye or a black pigment. The black coloring agent may include carbon black, a metal such as chromium, or oxide thereof.

The hole injection layer HIL and the hole transport layer HTL may be disposed between the pixel electrode AE and the light emitting layer EML. The hole injection layer HIL and the hole transport layer HTL may be disposed as common layers to overlap the entirety of the light emitting area PXA and the non-light emitting area NPXA. However, an embodiment is not limited thereto, and a portion of the hole injection layer HIL and the hole transport layer HTL may be provided by being patterned to overlap the light emitting area PXA and not to overlap a portion of the non-light emitting area NPXA. Any one of the hole injection layer HIL and the hole transport layer HTL may be omitted in the light emitting element LD, or the light emitting element LD may further include an electron blocking layer and the like disposed on the hole transport layer HTL.

The light emitting layer EML is disposed on the hole transport layer HTL. The light emitting layer EML may be disposed in the opening PDL-OP. For example, the light emitting layer EML may be formed separately to correspond to the light emitting area PXA divided by the pixel defining layer PDL. Each of the light emitting layer EML and the opening PDL-OP may be provided in plurality. In case that the light emitting layer EML is formed separately in each of the openings PDL-OP, each of the light emitting layers EML may emit light having at least one of blue, red, or green. The light emitting layer EML may include a fluorescent or phosphorescent material emitting red, green, or blue light. The light emitting layer EML may include a metal organic complex as a light emitting material. The light emitting layer EML may also include a quantum dot as a light emitting material.

The electron transport layer ETL and the electron injection layer EIL may be disposed between the light emitting layer EML and the common electrode CE. The electron transport layer ETL may be disposed as a common layer to overlap the entirety of the light emitting area PXA and the non-light emitting area NPXA. The electron injection layer EIL may be provided by being patterned to overlap the light emitting area PXA and not to overlap at least a portion of the non-light emitting area NPXA. Any one of the electron transport layer ETL and the electron injection layer EIL may be omitted in the light emitting element LD, or the light emitting element LD may further include a hole blocking layer disposed on a lower portion of the electron transport layer ETL.

Referring to FIG. 13, in the display module DM-R according to an embodiment, the inorganic absorption layer IF may be disposed not to overlap a pattern layer WAL. The pattern layer WAL may be disposed in the non-light emitting area NPXA. The pattern layer WAL may be disposed on the pixel defining layer PDL.

The common electrode CE and the inorganic absorption layer IF may be provided by being patterned by the pattern layer WAL. The common electrode CE and the inorganic absorption layer IF may not be disposed in the non-light emitting area NPXA.

Because the pixel defining layer PDL has a property of absorbing light in the display module DM-R of an embodiment, light is absorbed by the pixel defining layer PDL, and thus reflected light may be reduced even in case that the inorganic absorption layer IF is not disposed in the non-light emitting area NPXA. Because the common electrode CE and the inorganic absorption layer IF are removed from the non-light emitting area NPXA, the display module DM-R may have improved transmittance characteristics.

In the display module DM-R of the embodiment illustrated in FIG. 13, the capping layer CPL may be disposed on the inorganic absorption layer IF. The capping layer CPL may be provided as a common layer in the entirety of the light emitting area PXA and the non-light emitting area NPXA. Different from that illustrated in FIG. 13, the capping layer CPL may also be disposed on a lower portion of the inorganic absorption layer IF.

The reflection adjusting layer RCL-R may be disposed on the display panel DP. The display module DM-R according to an embodiment may reduce reflection by external light or reflection by internal metal layers by including the inorganic absorption layer IF included in the display panel DP and the reflection adjusting layer RCL-R.

In the display module DM-R according to an embodiment, the reflection adjusting layer RCL-R may include a dye. The reflection adjusting layer RCL-R may further include a pigment in addition to the dye. The reflection adjusting layer RCL-R may not include a division layer.

FIG. 14 is a schematic cross-sectional view of a display module DM-Ra according to an embodiment. The display module DM-Ra of the embodiment illustrated in FIG. 14 differs from the display module DM-R of the embodiment illustrated in FIG. 13 in that a capping layer CPL of the display module DM-Ra is provided by being patterned so as not to overlap a non-light emitting area NPXA.

Although the capping layer CPL is illustrated in FIG. 14 to be disposed on a lower portion of an inorganic absorption layer IF, an embodiment is not limited thereto, and the capping layer CPL may be provided by being disposed on the inorganic absorption layer IF and by being patterned so as not to overlap a pattern layer WAL.

In the display module DM-Ra according to an embodiment, the pattern layer WAL may be disposed on a pixel defining layer PDL in the non-light emitting area NPXA, and a common electrode CE, the inorganic absorption layer IF, and the capping layer CPL may be provided by being patterned so as not to overlap the pattern layer WAL.

The display module DM-Ra according to an embodiment may include the inorganic absorption layer IF disposed on a light emitting element layer DP-LD and a reflection adjusting layer RCL-R to exhibit characteristics of reduced reflected light. The display module DM-Ra exhibits improved transmittance characteristics because the common electrode CE, the inorganic absorption layer IF, and the capping layer CPL are removed from the non-light emitting area NPXA, and accordingly, an electronic device of an embodiment may have improved display quality.

The electronic device according to an embodiment may include in a display panel the inorganic absorption layer that is patterned so as not to overlap the pattern layer in a portion of a display area and may include the reflection adjusting layer that is disposed on the display panel and may include a dye, so that the electronic device may exhibit improved transmittance characteristics while having good low-reflection characteristics. The electronic device according to an embodiment may include a structure in which the inorganic absorption layer and the like are removed by disposing the pattern layer including a fluorine-based compound in a portion of the display area overlapping an electronic module, thereby exhibiting excellent display quality and exhibiting a characteristic of improved sensitivity of the electronic module.

According to an embodiment, an electronic device having improved transmittance may be provided by not disposing the inorganic absorption layer in a portion of the display area.

The electronic device according to an embodiment may have improved transmittance in the transmissive area to have improved quality of a signal, for example, an image, acquired by the electronic module disposed below the transmissive area.

Although embodiments have been described herein, it is understood that various changes and modifications can be made by those skilled in the art within the spirit and scope of the disclosure defined by the following claims and equivalents.

Therefore, the embodiments described herein are not intended to limit the technical spirit and scope of the disclosure, and all equivalents will be construed as being included in the scope of the disclosure.

What is claimed is:

1. An electronic device comprising:
an electronic module;
a display panel including:
a first display area overlapping the electronic module in a plan view;
a second display area not overlapping the electronic module in a plan view;
a light emitting element layer;
an inorganic absorption layer disposed on the light emitting element layer; and
an encapsulation layer disposed on the inorganic absorption layer; and
a reflection adjusting layer disposed on the display panel, the reflection adjusting layer including a dye, wherein
the first display area comprises:
an element area including:
a pixel electrode;
a hole transport layer disposed on the pixel electrode;
a light emitting layer disposed on the hole transport layer;
an electron transport layer disposed on the light emitting layer; and
a common electrode disposed on the electron transport layer; and
a transmissive area adjacent to the element area, the transmissive area including the hole transport layer, the electron transport layer, and a pattern layer disposed on the electron transport layer, and the transmissive area not including the light emitting layer and the common electrode, and
the inorganic absorption layer overlaps the element area in a plan view and does not overlap the transmissive area in a plan view.

2. The electronic device of claim 1, wherein the pattern layer comprises a fluorine-based compound.

3. The electronic device of claim 1, wherein the pattern layer does not overlap the common electrode and the inorganic absorption layer in a plan view.

4. The electronic device of claim 1, wherein the display panel comprises a capping layer disposed on an upper or lower portion of the inorganic absorption layer.

5. The electronic device of claim 4, wherein
the inorganic absorption layer is disposed between the common electrode and the capping layer, and
the capping layer overlaps the element area and the transmissive area in a plan view.

6. The electronic device of claim 4, wherein
the capping layer is disposed between the common electrode and the inorganic absorption layer, and
the capping layer overlaps the element area and the transmissive area in a plan view.

7. The electronic device of claim 6, wherein
the transmissive area comprises an upper pattern layer disposed on the capping layer,
the upper pattern layer includes a fluorine-based compound, and
the inorganic absorption layer does not overlap the upper pattern layer in a plan view.

8. The electronic device of claim 1, wherein the inorganic absorption layer comprises a single metal or an alloy having a refractive index of about 1 or higher and an extinction coefficient of about 5 or lower.

9. The electronic device of claim 8, wherein the inorganic absorption layer comprises at least one of a transition metal, a post-transition metal, a lanthanide metal, or an alloy of two or more metals selected from the transition metal, the post-transition metal, and the lanthanide metal.

10. The electronic device of claim 1, wherein the reflection adjusting layer overlaps the element area in a plan view and does not overlap the transmissive area in a plan view.

11. The electronic device of claim 1, wherein the reflection adjusting layer comprises:
a first dye having a maximum absorption wavelength in a range of about 420 nm to about 510 nm; and
a second dye having a maximum absorption wavelength in a range of about 550 nm to about 600 nm.

12. The electronic device of claim 1, wherein the reflection adjusting layer comprises a porphyrin-based dye or a tetraazaporphyrin-based dye.

13. The electronic device of claim 1, further comprising:
a sensor layer disposed between the display panel and the reflection adjusting layer,
wherein the sensor layer comprises:
a sensing base layer;
a first conductive layer disposed on the sensing base layer;
a second conductive layer disposed on the first conductive layer; and
a sensing insulating layer disposed between the first conductive layer and the second conductive layer.

14. The electronic device of claim 13, wherein
the reflection adjusting layer comprises a division layer that overlaps the second conductive layer in a plan view, and
the division layer does not overlap the first display area in a plan view.

15. The electronic device of claim 13, wherein the sensor layer is disposed directly on the encapsulation layer.

16. An electronic device comprising:
a display panel including:
an auxiliary display area including an element area and a transmissive area; and a main display area adjacent to the auxiliary display area; and a reflection adjusting layer disposed on the display panel, wherein the display panel comprises:
  a base layer;
  a circuit layer disposed on the base layer;
  a light emitting element layer disposed on the circuit layer;
  an encapsulation layer disposed on the light emitting element layer;
  a pattern layer disposed between the circuit layer and the encapsulation layer in the transmissive area; and
  an inorganic absorption layer that does not overlap the pattern layer in a plan view and is disposed between the light emitting element layer and the encapsulation layer.

17. The electronic device of claim 16, wherein
in the auxiliary display area, the light emitting element layer comprises:
  a pixel electrode disposed on the circuit layer and not overlapping the transmissive area in a plan view;
  a pixel defining pattern including an opening exposing a top surface of the pixel electrode;
  a hole transport layer disposed on the pixel electrode and provided as a common layer in the element area and the transmissive area;
  a light emitting layer disposed on the hole transport layer in the opening of the pixel defining pattern;
  an electron transport layer disposed on the light emitting layer and provided as a common layer in the element area and the transmissive area; and
  a common electrode disposed on the electron transport layer, and
the common electrode does not overlap the pattern layer in a plan view.

18. The electronic device of claim 17, wherein the display panel comprises a capping layer disposed between the light emitting element layer and the encapsulation layer.

19. The electronic device of claim 18, wherein the capping layer is disposed on a top surface of the inorganic absorption layer and is provided as a common layer in the element area and the transmissive area.

20. The electronic device of claim 18, wherein
the capping layer is disposed on a bottom surface of the inorganic absorption layer and is provided as a common layer in the element area and the transmissive area,
the display panel comprises an upper pattern layer disposed on the capping layer in the transmissive area, and
the inorganic absorption layer does not overlap the upper pattern layer in a plan view.

21. The electronic device of claim 18, wherein the capping layer is disposed on a top surface or a bottom surface of the inorganic absorption layer and does not overlap the pattern layer in a plan view.

22. The electronic device of claim 17, wherein
the display panel comprises an auxiliary pattern layer extending from the pattern layer and disposed on the pixel defining pattern, and
the inorganic absorption layer and the common electrode do not overlap the auxiliary pattern layer in a plan view.

23. The electronic device of claim 17, wherein
the light emitting element layer comprises an electron injection layer disposed between the electron transport layer and the common electrode, and
the electron injection layer does not overlap the pattern layer in a plan view.

24. The electronic device of claim 16, wherein
the reflection adjusting layer comprises a first dye having a maximum absorption wavelength in a range of about 420 nm to about 510 nm and a second dye having a maximum absorption wavelength in a range of about 550 nm to about 600 nm, and
the reflection adjusting layer does not overlap the transmissive area in a plan view.

25. The electronic device of claim 16, wherein the inorganic absorption layer comprises at least one of a transition metal, a post-transition metal, a lanthanide metal, or an alloy of two or more metals selected from the transition metal, the post-transition metal, and the lanthanide metal.

* * * * *